US012745664B2

(12) United States Patent
Lamarra et al.

(10) Patent No.: US 12,745,664 B2
(45) Date of Patent: Sep. 22, 2026

(54) WIRE BONDING ARRAYS, MAINTENANCE STATIONS FOR WIRE BONDING ARRAYS, AND RELATED METHODS

(71) Applicant: Kulicke and Soffa Industries, Inc., Fort Washington, PA (US)

(72) Inventors: Michael Christopher Lamarra, Harleysville, PA (US); Manoj Kumar Venna, Singapore (SG)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 19/062,494

(22) Filed: Feb. 25, 2025

(65) Prior Publication Data

US 2025/0286014 A1 Sep. 11, 2025

Related U.S. Application Data

(60) Provisional application No. 63/562,833, filed on Mar. 8, 2024, provisional application No. 63/650,997, filed on May 23, 2024.

(51) Int. Cl.
*H10W 72/00* (2026.01)
*B23K 20/10* (2006.01)

(52) U.S. Cl.
CPC ......... *H10W 72/0711* (2026.01); *B23K 20/10* (2013.01); *H10W 72/07178* (2026.01)

(58) Field of Classification Search
None
See application file for complete search history.

(56) References Cited

U.S. PATENT DOCUMENTS 6,112,972 A * 9/2000 Koduri .................... H01L 24/78 228/180.5
8,593,261 B2 * 11/2013 Takagi .................. G05B 19/12 340/10.51
8,672,210 B2 * 3/2014 Kim .................... B23K 20/005 228/180.5

(Continued)

FOREIGN PATENT DOCUMENTS

JP 2008-141025 6/2008
KR 2015142717 A * 12/2015

(Continued)

OTHER PUBLICATIONS

International Search Report for PCT application No. PCT/US2025/017153 mailed Oct. 22, 2025.

*Primary Examiner* — Devang R Patel
(74) *Attorney, Agent, or Firm* — Christopher M. Spletzer, Sr.

(57) ABSTRACT

A wire bonding array is provided. The wire bonding array includes a plurality of wire bonding systems, each of the plurality of wire bonding systems including a bond head assembly for bonding a wire to a workpiece and a support structure for supporting the workpiece. The wire bonding array also includes a wire bonding tool replacement system configured for installation on, and removal from, each of the plurality of wire bonding systems. The wire bonding array also includes a service robot configured to install the wire bonding tool replacement system on, and remove the wire bonding tool replacement system from, each of the plurality of wire bonding systems.

19 Claims, 34 Drawing Sheets

(56) References Cited

U.S. PATENT DOCUMENTS

| | | | | |
|---|---|---|---|---|
| 9,482,605 | B2 * | 11/2016 | Deards | G01N 19/04 |
| 2007/0181651 | A1 * | 8/2007 | Takahashi | H01L 24/85<br>228/101 |
| 2014/0109398 | A1 * | 4/2014 | Choi | B23P 19/04<br>29/700 |
| 2018/0294245 | A1 | 10/2018 | Kim et al. | |
| 2021/0162681 | A1 | 6/2021 | Furuyashiki et al. | |
| 2022/0187353 | A1 | 6/2022 | DeAngelis et al. | |
| 2025/0162060 | A1 | 5/2025 | Jing et al. | |
| 2025/0162093 | A1 | 5/2025 | Venna et al. | |

FOREIGN PATENT DOCUMENTS

| | | | | |
|---|---|---|---|---|
| KR | 20170032145 | A | * | 3/2017 |
| KR | 10-2020-0126447 | | | 11/2020 |

* cited by examiner

WIRE BONDING ARRAYS, MAINTENANCE STATIONS FOR WIRE BONDING ARRAYS, AND RELATED METHODS

CROSS-REFERENCE TO RELATED APPLICATIONS

This application claims the benefit of U.S. Provisional Application No. 63/562,833, filed on Mar. 8, 2024, and U.S. Provisional Application No. 63/650,997, filed on May 23, 2024, the contents of both are incorporated herein by reference.

FIELD

The invention relates to wire bonding arrays, maintenance stations for wire bonding arrays, and related methods.

BACKGROUND

In the processing and packaging of semiconductor devices, wire bonding continues to be a primary method of providing electrical interconnection between two locations within a package (e.g., between a die pad of a semiconductor die and a lead of a leadframe). More specifically, using a wire bonder (also known as a wire bonding system) wire loops are formed between respective locations to be electrically interconnected. The primary methods of forming wire loops are ball bonding and wedge bonding. In forming the bonds between (a) the ends of the wire loop and (b) the bond site (e.g., a die pad, a lead, etc.) varying types of bonding energy may be used, including, for example, ultrasonic energy, thermosonic energy, thermocompressive energy, amongst others. Wire bonding systems are also used to form conductive bumps from portions of wire, and vertical wire structures (e.g., bonded at a single bond site).

Replacement of a wire bonding tool on a wire bonding system (and/or other related maintenance) often results in significant delays or machine downtime, and utilizes an operator to accomplish the replacement/maintenance. Thus, it would be desirable to provide improved systems and methods for addressing such deficiencies.

SUMMARY

According to an exemplary embodiment of the invention, a wire bonding array is provided. The wire bonding array includes a plurality of wire bonding systems, each of the plurality of wire bonding systems including (i) a bond head assembly for bonding a wire to a workpiece and (ii) a support structure for supporting the workpiece. The wire bonding array also includes a wire bonding tool replacement system configured for installation on, and removal from, each of the plurality of wire bonding systems. The wire bonding array also includes a service robot configured to install the wire bonding tool replacement system on, and remove the wire bonding tool replacement system from, each of the plurality of wire bonding systems.

According to other embodiments of the invention, the wire bonding array recited in the immediately preceding paragraph may have any one or more of the following features: each of the plurality of wire bonding systems includes a docking station configured to receive the wire bonding tool replacement system; the docking station includes a connector for providing power and data to the wire bonding tool replacement system; the docking station includes locator pins for aligning the wire bonding tool replacement system during installation; at least one additional wire bonding tool replacement system configured for installation on, and removal from, each of the plurality of wire bonding systems; and the service robot includes a base for moving the service robot with respect to the plurality of wire bonding systems, the base being positioned above a receiving portion of each of the plurality of wire bonding systems configured to receive the wire bonding tool replacement system.

According to another exemplary embodiment of the invention, a wire bonding array is provided. The wire bonding array includes a plurality of wire bonding systems, each of the plurality of wire bonding systems including (i) a bond head assembly for bonding a wire to a workpiece and (ii) a support structure for supporting the workpiece. The wire bonding array also includes a maintenance station including a plurality of wire bonding tool replacement systems, each of the plurality of wire bonding tool replacement systems being configured for installation on, and removal from, each of the plurality of wire bonding systems. The wire bonding array also includes a service robot configured to move ones of the plurality of wire bonding tool replacement systems between the maintenance station and ones of the plurality of wire bonding systems.

According to other embodiments of the invention, the wire bonding array recited in the immediately preceding paragraph may have any one or more of the following features: each of the plurality of wire bonding systems includes a docking station configured to receive each of the plurality of wire bonding tool replacement systems; the maintenance station includes a plurality of docking stations, each of the plurality of docking stations configured to receive each of the plurality of wire bonding tool replacement systems; the maintenance station includes a replacement assembly configured to remove a waste from each of the plurality of wire bonding tool replacement systems, the waste including at least one of (i) an empty wire bonding tool tray configured for holding a plurality of wire bonding tools and (ii) at least one used wire bonding tool; the maintenance station further includes a receptacle for receiving the waste from the plurality of wire bonding tool replacement systems from the replacement assembly; the maintenance station further includes a plurality of wire bonding tool trays, each of the plurality of wire bonding tool trays including a plurality of wire bonding tools; the maintenance station includes a replacement assembly configured to load one of the plurality of wire bonding tool trays into one of the plurality of wire bonding tool replacement systems; the maintenance station further includes a charging station for the service robot; the service robot is further configured to move ones of the plurality of wire bonding tool replacement systems directly between ones of the plurality of wire bonding systems; and the service robot includes a base for moving the service robot with respect to the plurality of wire bonding systems, the base being positioned above a receiving portion of each of the plurality of wire bonding systems configured to receive each of the plurality of wire bonding tool replacement systems.

According to yet another exemplary embodiment of the invention, a maintenance station for servicing a wire bonding array is provided. The maintenance station includes a plurality of wire bonding tool replacement systems, each of the plurality of wire bonding tool replacement systems being configured for installation on, and removal from, a wire bonding system.

According to other embodiments of the invention, the maintenance station recited in the immediately preceding paragraph may have any one or more of the following features: a plurality of docking stations configured to receive any one of the plurality of wire bonding tool replacement systems; a replacement assembly configured to remove a waste from each of the plurality of wire bonding tool replacement systems, the waste including at least one of (i) an empty wire bonding tool tray configured for holding a plurality of wire bonding tools and (ii) at least one used wire bonding tool; a receptacle for receiving the waste from the plurality of wire bonding tool replacement systems; a plurality of wire bonding tool trays, each of the plurality of wire bonding tool trays including a plurality of wire bonding tools; a replacement assembly configured to load one of the plurality of wire bonding tool trays into one of the plurality of wire bonding tool replacement systems; a service robot configured to move ones of the plurality of wire bonding tool replacement systems between the maintenance station and ones of a plurality of wire bonding systems; a charging station for the service robot; and the service robot includes a base for moving with respect to the plurality of wire bonding systems, the base being positioned above a receiving portion of each of the plurality of wire bonding systems configured to receive each of the plurality of wire bonding tool replacement systems.

According to yet another exemplary embodiment of the invention, a method of servicing a wire bonding array is provided. The method includes steps of: (a) providing the wire bonding array that includes (i) a plurality of wire bonding systems, each of the plurality of wire bonding systems including a bond head assembly for bonding a wire to a workpiece and a support structure for supporting the workpiece, the bond head assembly including a wire bonding tool, (ii) a wire bonding tool replacement system configured for installation on, and removal from, each of the plurality of wire bonding systems, and (iii) a service robot configured to install the wire bonding tool replacement system on, and remove the wire bonding tool replacement system from, each of the plurality of wire bonding systems; (b) carrying the wire bonding tool replacement system using the service robot to one of the plurality of wire bonding systems; and (c) installing the wire bonding tool replacement system on the one of the plurality of wire bonding systems using the service robot.

According to other embodiments of the invention, the method recited in the immediately preceding paragraph may have any one or more of the following features: a step of (d) removing the wire bonding tool replacement system from the one of the plurality of wire bonding systems with the service robot after step (c); a step of (e1) carrying the wire bonding tool replacement system to another of the plurality of wire bonding systems with the service robot after step (d), and a step of (f1) installing the wire bonding tool replacement system on the another of the plurality of wire bonding systems after step (e1); a step of (e2) carrying the wire bonding tool replacement system to a maintenance station with the service robot after step (d), and a step of (f2) installing the wire bonding tool replacement system on a docking station of the maintenance station after step (e2); and step (a) includes providing the service robot including a base for moving the service robot with respect to the plurality of wire bonding systems, the base being positioned above a receiving portion of each of the plurality of wire bonding systems configured to receive the wire bonding tool replacement system.

According to yet another exemplary embodiment of the invention, a method of servicing a wire bonding array is provided. The method includes steps of: (a) providing the wire bonding array that includes (i) a plurality of wire bonding systems, each of the plurality of wire bonding systems including a bond head assembly for bonding a wire to a workpiece and a support structure for supporting the workpiece, the bond head assembly including a wire bonding tool, (ii) a maintenance station including a plurality of wire bonding tool replacement systems, each of the plurality of wire bonding tool replacement systems being configured for installation on, and removal from, each of the plurality of wire bonding systems; and (iii) a service robot configured to install ones of the plurality of wire bonding tool replacement systems on, and remove from, each of the plurality of wire bonding systems; (b) carrying one of the plurality of wire bonding tool replacement systems from the maintenance station to one of the plurality of wire bonding systems with the service robot; and (c) installing the one of the plurality of wire bonding tool replacement systems on the one of the plurality of wire bonding systems using the service robot.

According to other embodiments of the invention, the method recited in the immediately preceding paragraph may have any one or more of the following features: a step of (d) removing the one of the plurality of wire bonding tool replacement systems from the one of the plurality of wire bonding systems with the service robot after step (c); a step of (e1) carrying the one of the plurality of wire bonding tool replacement systems to another of the plurality of wire bonding systems with the service robot after step (d), and a step of (f1) installing the one of the plurality of wire bonding tool replacement systems on the another of the plurality of wire bonding systems after step (e1); a step of (e2) carrying the one of the plurality of wire bonding tool replacement systems to the maintenance station with the service robot after step (d), and a step of (f2) installing the one of the plurality of wire bonding tool replacement systems on a docking station of the maintenance station after step (e2); and step (a) includes providing the service robot including a base for moving the service robot with respect to the plurality of wire bonding systems, the base being positioned above a receiving portion of each of the plurality of wire bonding systems configured to receive each of the plurality of wire bonding tool replacement systems.

According to yet another exemplary embodiment of the invention, a method of operating a maintenance station of a wire bonding array is provided. The method includes steps of: (a) providing the maintenance station including (i) a plurality of wire bonding tool replacement systems, each of the plurality of wire bonding tool replacement systems being configured for installation on, and removal from, a wire bonding system, (ii) a plurality of wire bonding tool trays, each of the plurality of wire bonding tool trays including a plurality of wire bonding tools, and (iii) a replacement assembly configured to load one of the plurality of wire bonding tool trays into one of the plurality of wire bonding tool replacement systems; and (b) installing one of the plurality of wire bonding tool trays in one of the plurality of wire bonding tool replacement systems using the replacement assembly.

According to other embodiments of the invention, the method recited in the immediately preceding paragraph may have any one or more of the following features: a step of removing an empty wire bonding tool tray from the one of the plurality of wire bonding tool replacement systems with the replacement assembly prior to step (b); and a step of removing at least one used wire bonding tool from a used wire bonding tool receptacle of the one of the plurality of wire bonding tool replacement systems with the replacement assembly.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

As used herein, the term "wire bonding array" refers to a group of wire bonding systems (e.g., within a production environment, such as a factory). The term "wire bonding array" may include wire bonding systems of different types (e.g., wedge bonders and ball bonders), different model numbers, different manufacturers, different processes, etc. Further, a wire bonding array may include wire bonding systems having different functions within the array (e.g., wire bonding different types of wire, different types of workpieces, etc.). Further still, the term "wire bonding array" may include additional machines, systems, or arrays that support the wire bonding array (e.g., computers for monitoring and/or controlling a factory environment, maintenance stations, service robots, etc.).

As used herein, the term "wire bonding tool tray" is intended to refer to any type of structure that holds a plurality of wire bonding tools.

Figure 1A:
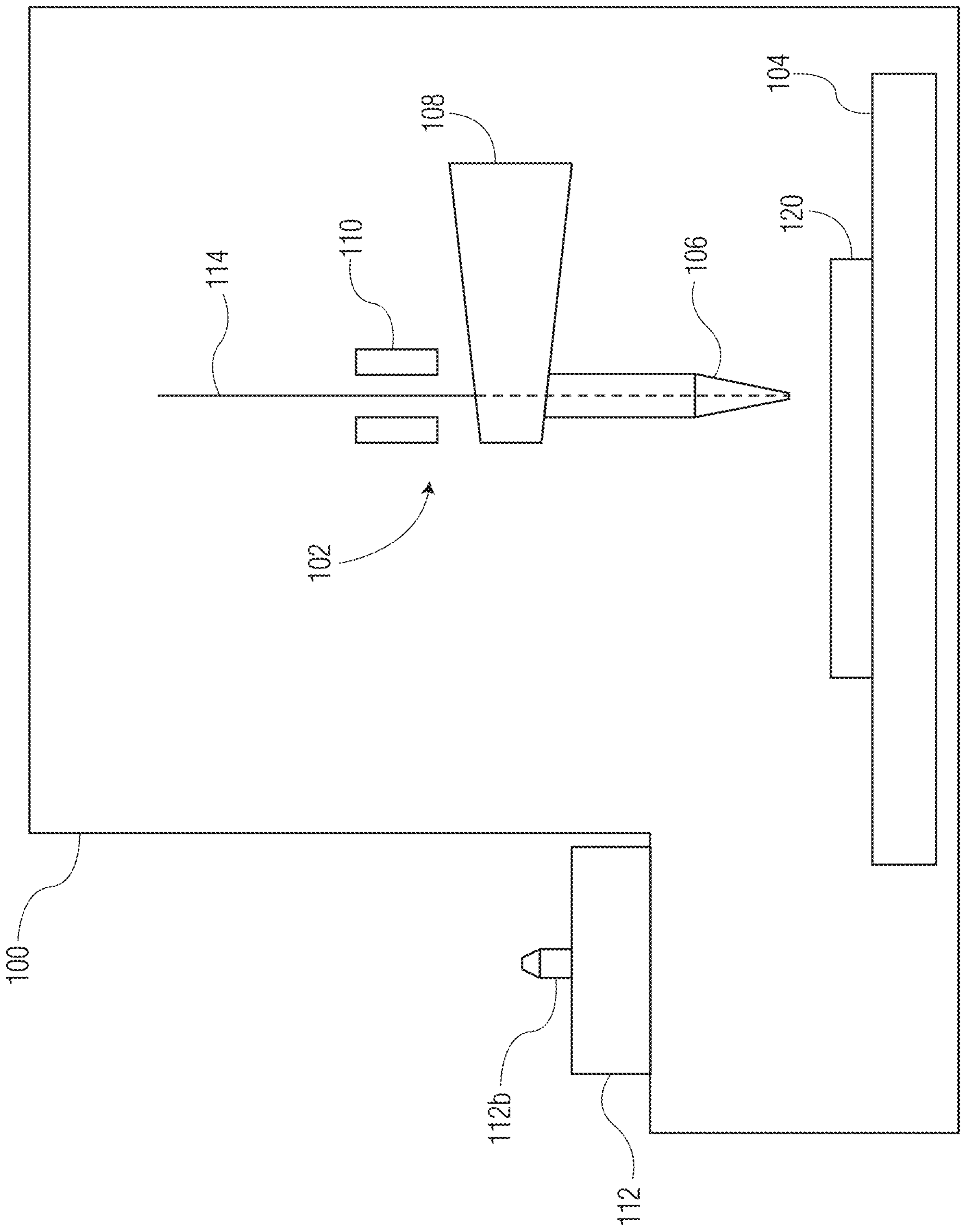
FIGS. 1A-1C are block diagram side views illustrating a wire bonding system in accordance with an exemplary embodiment of the invention.
Figure 1B:
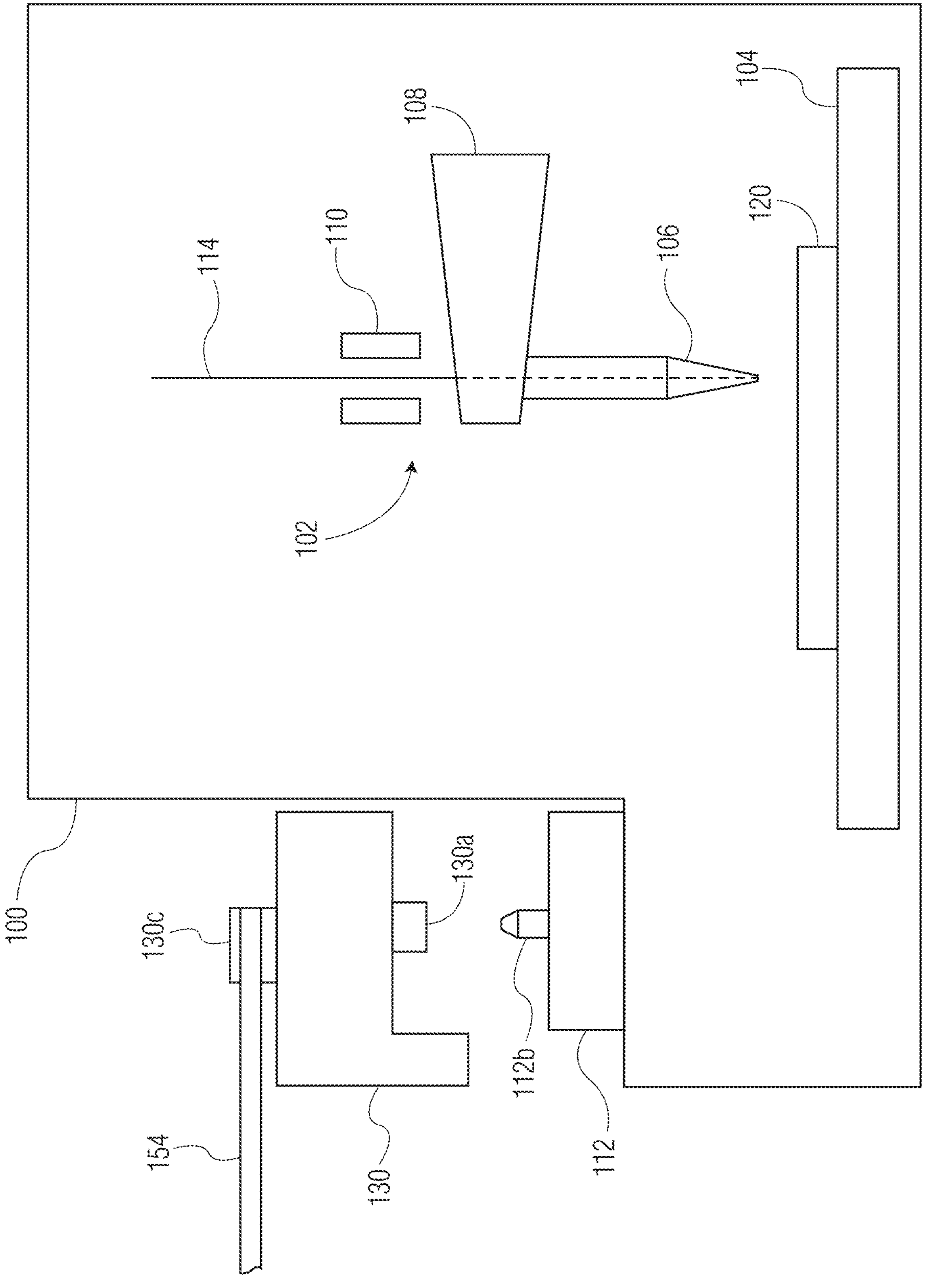
Figure 1C:
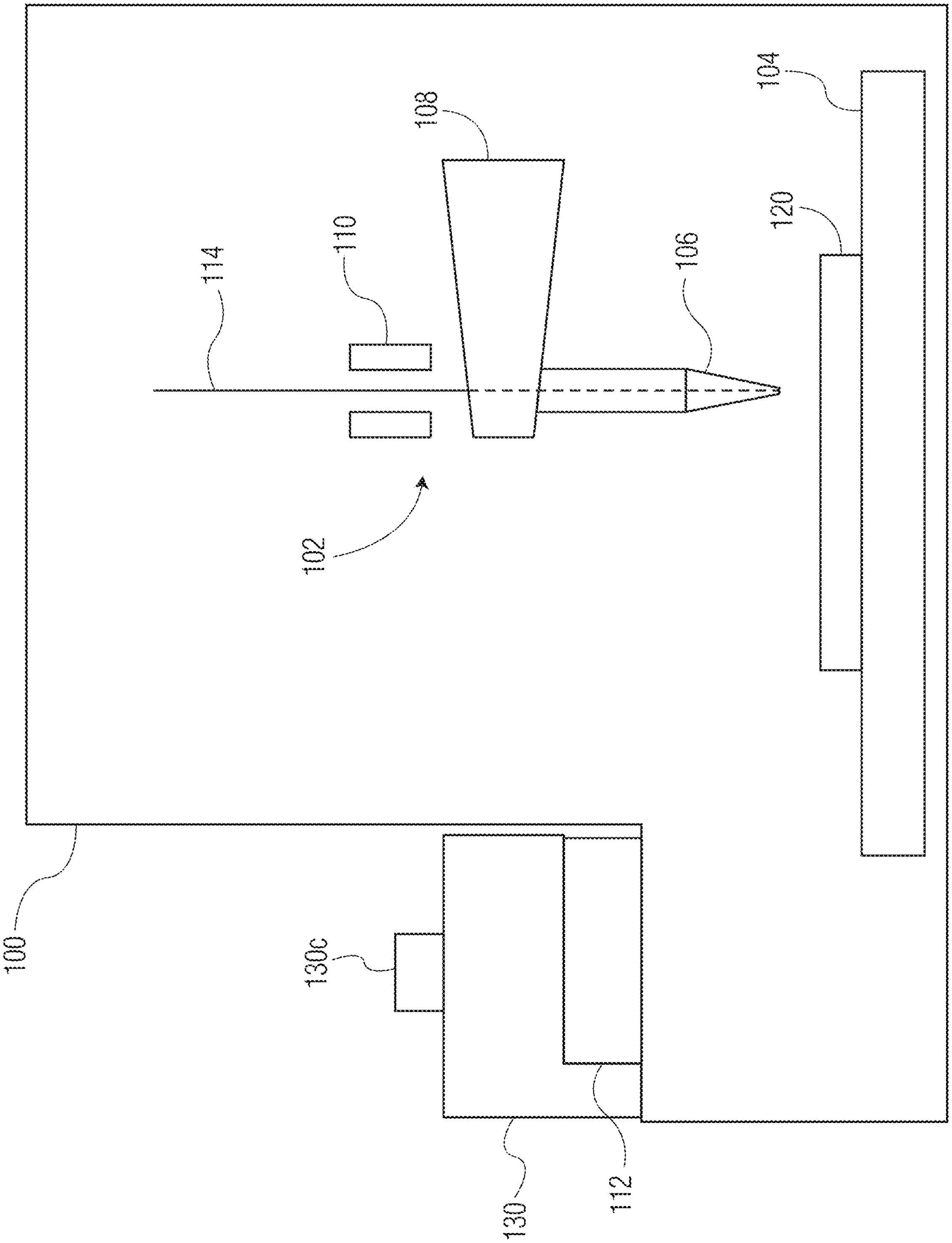

Referring now to FIGS. 1A-1C, an exemplary wire bonding system 100 is illustrated in a simplified form. Wire bonding system 100 includes a bond head assembly 102, a support structure 104, and a docking station 112. Bond head assembly 102 includes a wire clamp 110, a transducer 108, and a wire bonding tool 106 held by transducer 108. A wire 114 is threaded through wire bonding tool 106. Wire bonding tool 106 is configured to bond a portion of wire 114 to a workpiece 120. Workpiece 120 may be any type of workpiece configured for wire bonding. An exemplary workpiece includes a semiconductor element (e.g., a semiconductor die, an LED, etc.) disposed on a substrate (e.g., leadframe, another semiconductor die, a PCB, etc.). Workpiece 120 is supported by support structure 104. Docking station 112 is configured to receive a wire bonding tool replacement system 130. Docking station 112 includes locator pins **112*b* configured to guide a wire bonding tool replacement system 130 into the correct position during installation of wire bonding tool replacement system 130 on wire bonding system 100**.

FIG. 1B illustrates wire bonding system 100, wire bonding tool replacement system 130, and a robot arm 154 that is carrying wire bonding tool replacement system 130. Wire bonding tool replacement system 130 is configured to remove and replace wire bonding tool 106. A full description of exemplary wire bonding tool replacement systems can be found in U.S. patent application Ser. No. 18/947,365 and U.S. patent application Ser. No. 18/947,209, the contents of which are incorporated herein by reference. A general description of the wire bonding tool replacement system can be found herein in connection with FIGS. 3A-3B.

FIG. 1B illustrates wire bonding tool replacement system 130 including a handle **130*c* and a connector 130*a*. Handle 130*c* can be engaged by robot arm 154. Robot arm 154 is part of a service robot 150 that is described in detail herein in connection with several figure series (e.g., FIGS. 4A-4E). Robot arm 154 is configured to engage handle 130*c* in order to install wire bonding tool replacement system 130 on and/or remove wire bonding tool replacement system 130 from wire bonding system 100. Connector 130*a* is capable of forming an electrical connection to transmit power and/or data (e.g., position information, execution instructions, information logs, etc.) between wire bonding tool replacement system 130 and wire bonding system 100 with a corresponding connector 112*a* of docking station 112 (see FIGS. 2A-2B). FIG. 1C illustrates wire bonding tool replacement system 130 in an installed position on docking station 112**.

Figure 2A:
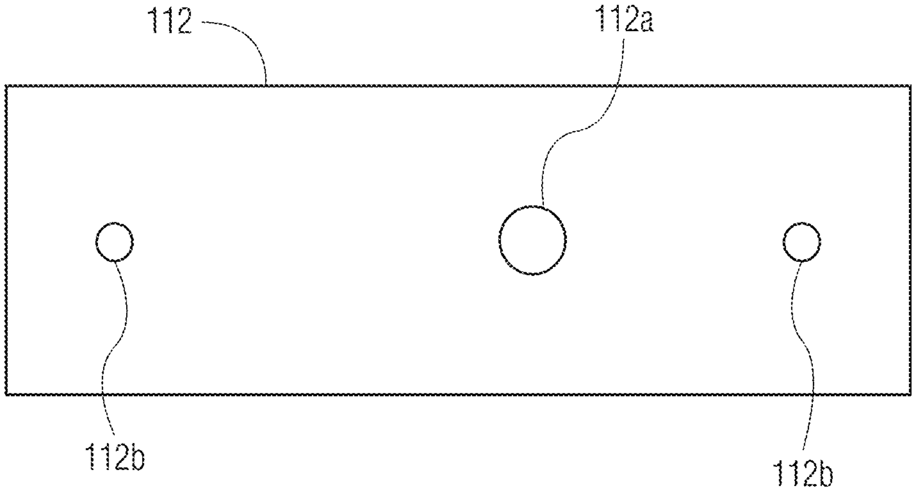
FIG. 2A is a block diagram top view illustrating a docking station for a wire bonding tool replacement system in accordance with an exemplary embodiment of the invention.
Figure 2B:
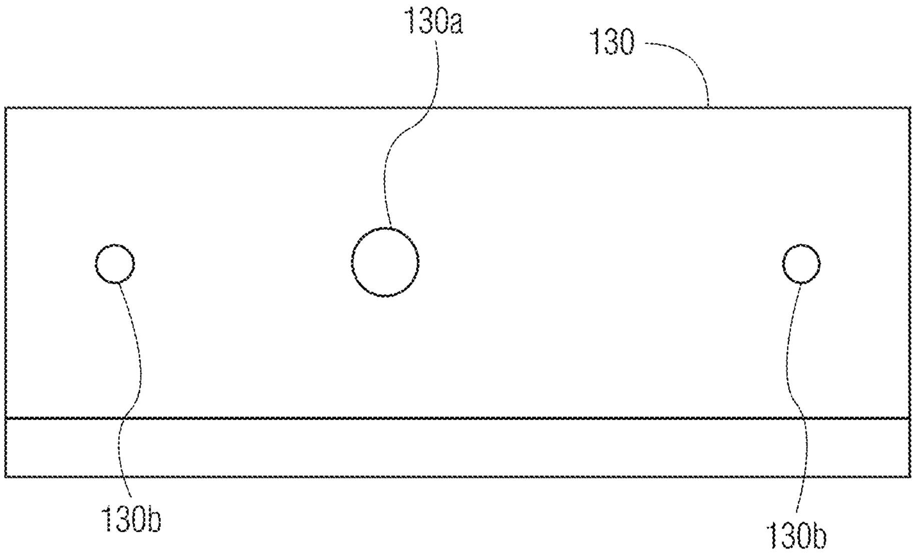
FIG. 2B is a block diagram bottom view illustrating a wire bonding tool replacement system corresponding to the docking station in FIG. 2A in accordance with an exemplary embodiment of the invention.

FIGS. 2A-2B illustrate details related to the alignment and installation of wire bonding tool replacement system 130 on docking station 112. FIG. 2A is a top view of docking station 112, and FIG. 2B is a corresponding bottom view of exemplary wire bonding tool replacement system 130. Docking station 112 includes locator pins **112*b* (see e.g., locator pin 112*b* in FIGS. 1A and 1B). Locator pins 112*b* are used to guide wire bonding tool replacement system 130 into the correct position during installation as they interface with corresponding locator holes 130*b* on wire bonding tool replacement system 130. Locator pins 112*b* and locator holes 130***b* ensure that connector 130*a* of wire bonding tool replacement system 130 aligns with a connector 112*a* of docking station 112. As shown, wire bonding tool replacement system 130 has a male connector, and docking station 112 has a female connector, but the invention is not so limited. Further, different and/or additional alignment structures are contemplated (e.g., guide rails, alignment slots, navigational software, etc.).

Although wire bonding system 100 has been illustrated and described as including a docking station, the invention is not limited to such. It is contemplated that a wire bonding system may have any suitable receiving portion configured to receive a wire bonding tool replacement system (e.g., a designated flat area, a shelf, a hanger for holding the wire bonding tool replacement system, or any other structure capable of supporting the wire bonding tool replacement system).

Figure 3A:
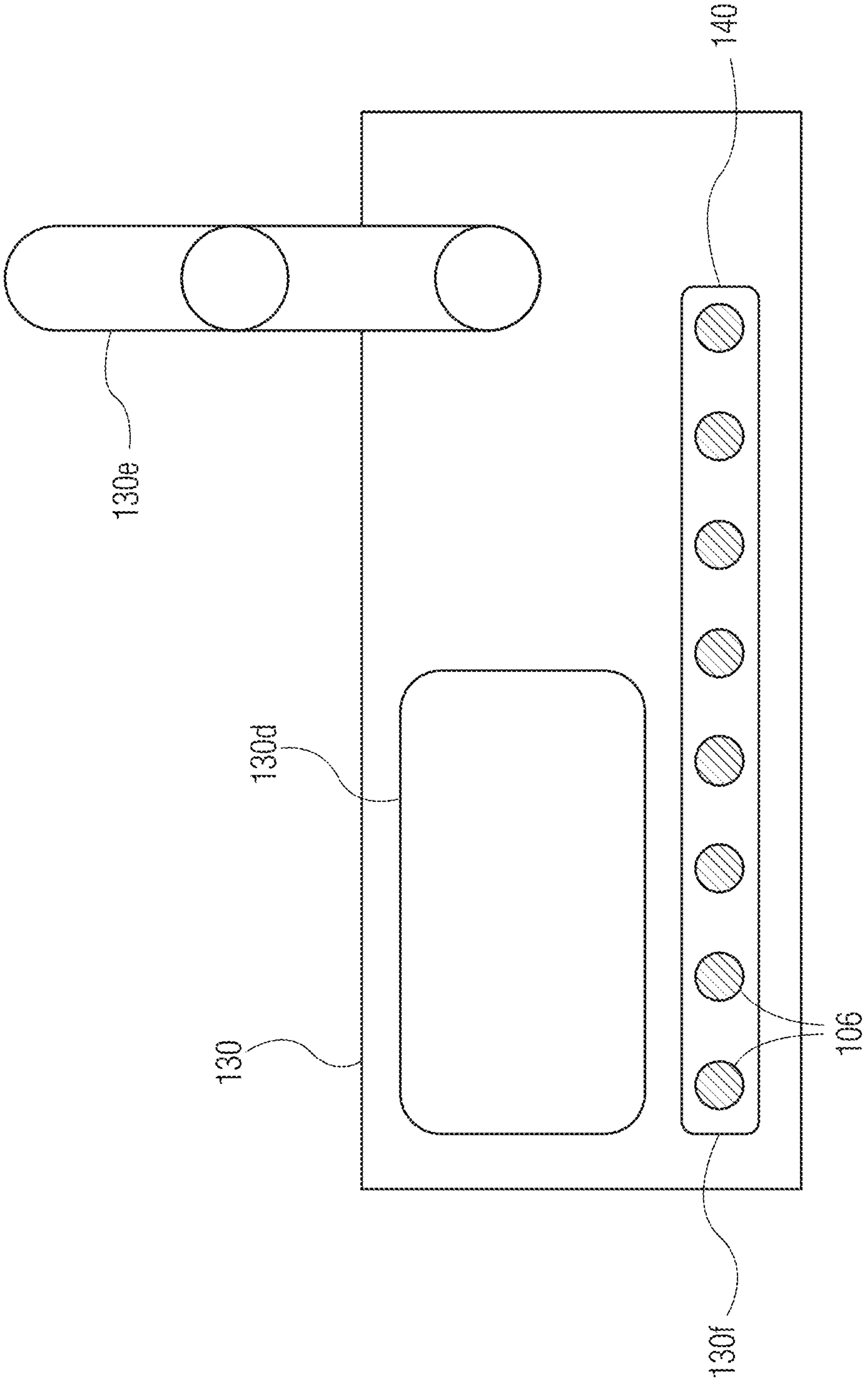
FIGS. 3A-3B are block diagram top views illustrating a wire bonding tool replacement system useful in illustrating various exemplary embodiments of the invention.
Figure 3B:
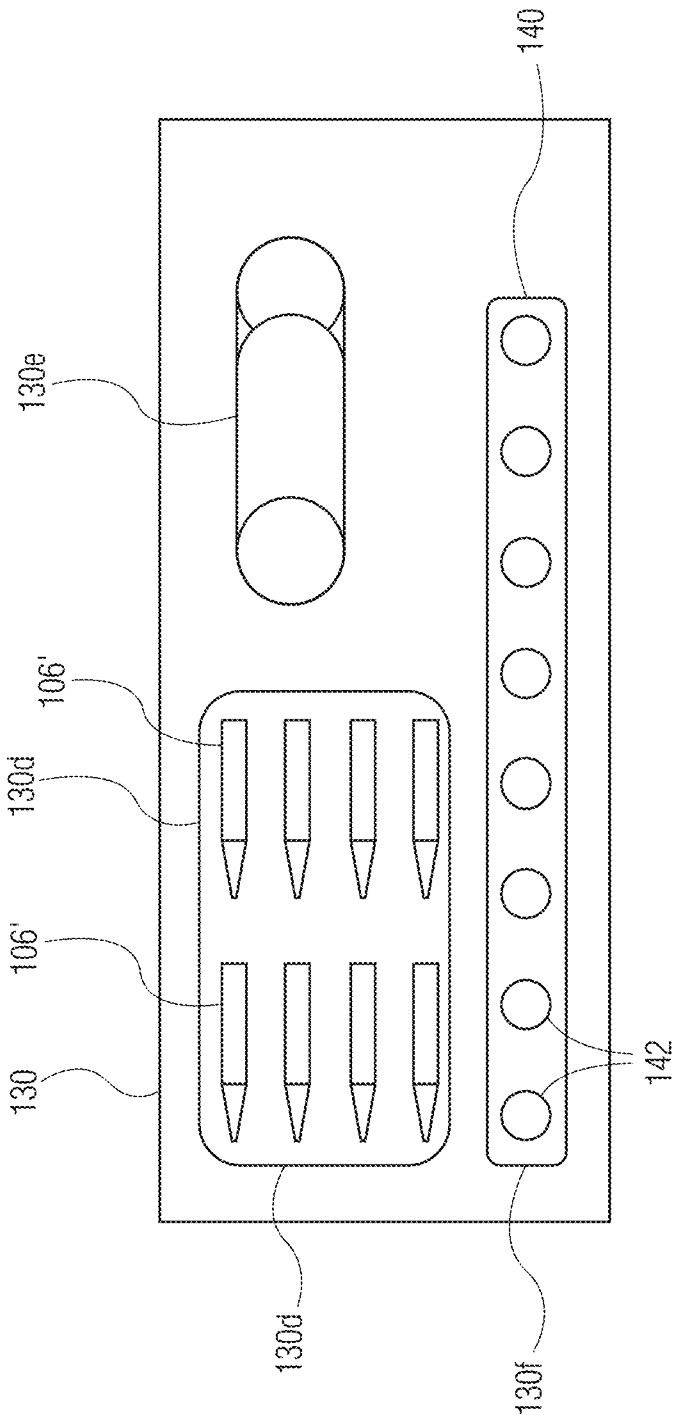

FIGS. 3A-3B illustrate an exemplary wire bonding tool replacement system 130 illustrating different features (with connector 130*a*, locator holes 130*b*, and handle 130*c* not illustrated in FIGS. 3A-3B for simplicity). Wire bonding tool replacement system 130 includes a used wire bonding tool receptacle 130*d*, a maintenance arm 130*e*, and a wire bonding tool tray holder 130*f*. Used wire bonding tool receptacle 130*d* is configured for holding used wire bonding tools 106' after they are removed from a wire bonding system. Maintenance arm 130*e* is capable of extending outward to perform the actions of removing and replacing a wire bonding tool on a wire bonding system (e.g., gripping an installed wire bonding tool, releasing the installed wire bonding tool from a transducer, removing the installed wire bonding tool from the transducer, gripping a new wire bonding tool, installing the new wire bonding tool, etc.). Wire bonding tool tray holder 130*f* is configured to receive a wire bonding tool tray 140. Wire bonding tool tray 140 is configured to include a plurality of wire bonding tools 106. Wire bonding tool tray 140 may include a single type of wire bonding tool, or it may include various types of wire bonding tools, depending on the requirements of the application.

FIG. 3A illustrates wire bonding tool replacement system 130 in a "ready" state with maintenance arm 130*e* extended. In FIG. 3A, in this example "ready" state, used wire bonding tool receptacle 130*d* is empty, and wire bonding tool tray 140 contains the maximum number of wire bonding tools 106 (e.g., as shown, the maximum number of wire bonding tools is eight). It should be understood that for a wire bonding tool replacement system 130 to be "ready" it does not need to have an empty used wire bonding tool receptacle 130*d*, and/or it does not need to have a full wire bonding tool tray 140. For example, in order to be "ready", a wire bonding tool replacement system 130 simply needs to include at least one wire bonding tool 106 in wire bonding tool tray 140 to be provided to a wire bonding system.

FIG. 3B illustrates wire bonding tool replacement system 130 in an "depleted" state with maintenance arm 130*e* retracted. In FIG. 3B, in this "depleted" state, used wire bonding tool receptacle 130*d* includes a plurality of used wire bonding tools 106', and wire bonding tool tray 140 is empty (e.g., a plurality of wire bonding tool slots 142 of wire bonding tool tray 140 are empty).

Wire bonding tool replacement system 130 may be installed on a single wire bonding system for a long period of time to automatically replace a wire bonding tool of the single wire bonding system when needed. However, wire bonding tool replacement system 130 is also capable of serving an array of wire bonding systems (e.g., an array including multiple wire bonding systems 100) in a factory setting. The wire bonding systems in an exemplary wire bonding array may be configured to calculate an interval at which wire bonding tools need to be replaced (e.g., using a computer on the wire bonding system). Such a calculation may include factors such as a number of bonds, an amount of time, a change in process type/step, an expected tool life, a bond performance evaluation, environmental factors, etc. A wire bonding array also includes a service robot configured to install, and remove, the wire bonding tool replacement system from each of the wire bonding systems. The service robot is capable of moving a wire bonding tool replacement system directly between wire bonding systems and/or between wire bonding systems and a central wire bonding tool replacement system storage area (e.g., a maintenance station, described herein).

For example, when a wire bonding system requires a new wire bonding tool, it may (i) send a signal to a central computer of the wire bonding array, (ii) send a signal to a maintenance station, which would in turn instruct the service robot, and/or (iii) send a signal directly to the service robot. A central computer, maintenance station, or service robot may store identification and/or location information of each wire bonding system (along with the status of each wire bonding tool replacement system, that is "ready" or "depleted"). Such a central computer, maintenance station, or service robot may also be capable of sending and receiving instructions to and from components (e.g., wire bonding systems, a service robot, a maintenance station, etc.) of the wire bonding array. When a signal is received to change a wire bonding tool, the service robot may bring the wire bonding tool replacement system (that is known to be "ready") to the wire bonding system that requires wire bonding tool replacement. After replacing the wire bonding tool, the wire bonding tool replacement system may then be moved to another wire bonding system that requires a wire bonding tool replacement or returned to a centralized location for storing and/or servicing wire bonding tool replacement systems (e.g., a maintenance station, described herein).

FIGS. 4A-4E, 5A-5E, 6A-6D, and 7A-7E illustrate exemplary processes for servicing a wire bonding array with a plurality of wire bonding tool replacement systems 130 by utilizing a service robot 150. Specifically, FIGS. 4A-4E illustrate service robot 150 moving one of the plurality of wire bonding tool replacement systems 130 from a maintenance station 118 to one of the plurality of wire bonding systems 100. FIGS. 5A-5E illustrate service robot 150 moving one of the plurality of wire bonding tool replacement systems 130 directly between ones of the plurality of wire bonding systems 100. FIGS. 6A-6D illustrate service robot 150 moving one of the plurality of wire bonding tool replacement systems 130 from one of the plurality of wire bonding systems 100 to maintenance station 118. FIGS. 7A-7E illustrate service robot 150 moving another of the plurality of wire bonding tool replacement systems 130 to another of the plurality of wire bonding systems 100.

Figure 4A:
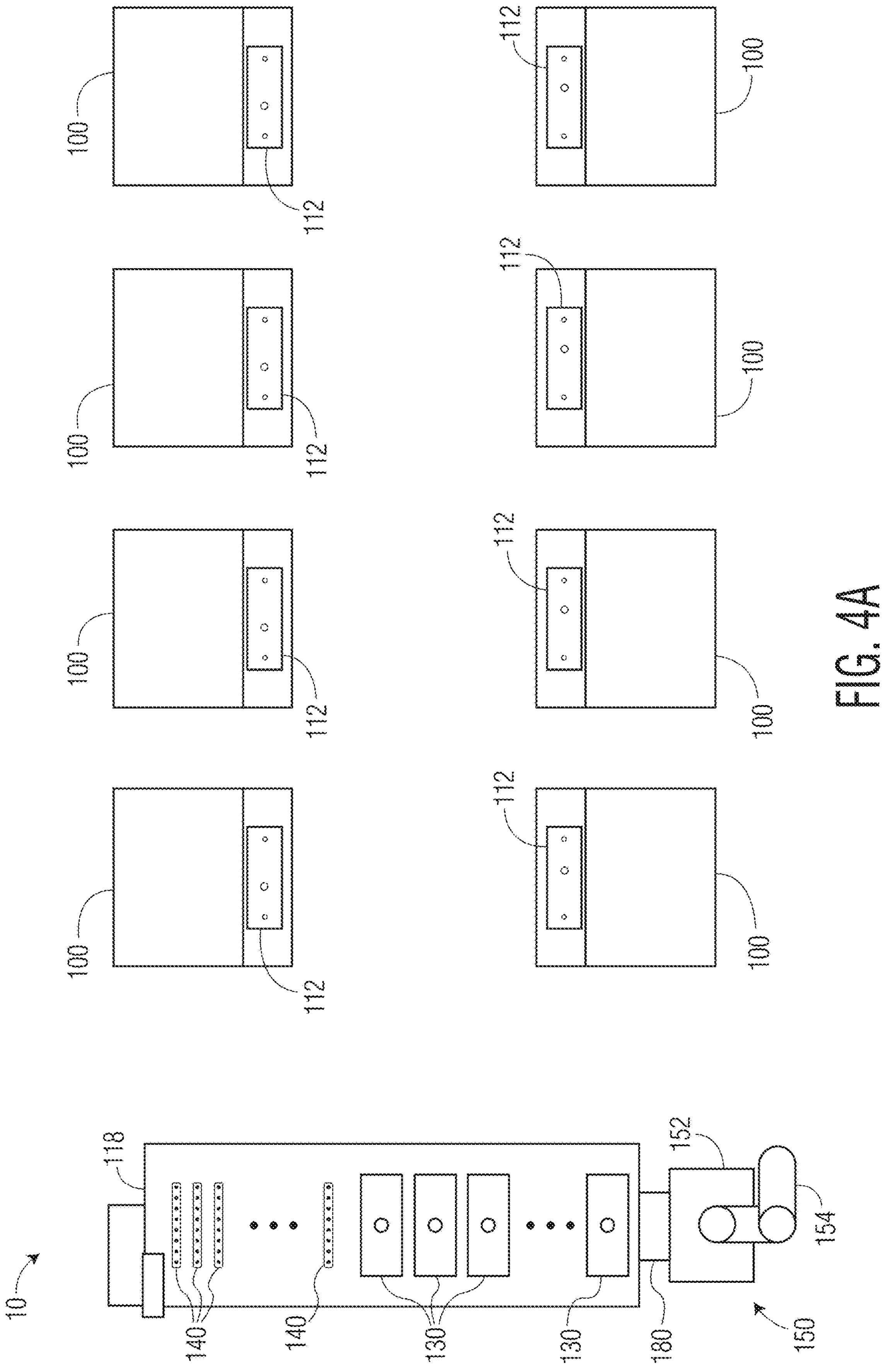
FIGS. 4A-4E are block diagrams of a wire bonding array illustrating a method of servicing the wire bonding array in accordance with an exemplary embodiment of the invention.

Referring to FIG. 4A, an exemplary wire bonding array 10 is shown. Wire bonding array 10 includes a plurality of wire bonding systems 100, a maintenance station 118, and a service robot 150. Each of the plurality of wire bonding systems 100 includes a bond head assembly for bonding a wire to a workpiece and a support structure for supporting the workpiece (e.g., see FIGS. 1A-1C). Each of the plurality of wire bonding systems 100 further includes a docking station 112 (e.g., see FIGS. 2A-2B), each docking station 112 configured to receive any one of a plurality of wire bonding tool replacement systems 130. Maintenance station

118 includes the plurality of wire bonding tool replacement systems 130 (e.g., see FIGS. 3A-3B). Maintenance station 118 further includes a plurality of wire bonding tool trays 140. Maintenance station 118 also includes a robot charging station 180. Service robot 150 includes a robot base 152 and robot arm 154. Robot base 152 carries service robot 150 relative to the plurality of wire bonding systems 100. Service robot 150 is configured to move throughout the wire bonding array 10, e.g., by treads, wheels, overhead cables, a track, etc., via robot base 152.

Figure 4B:
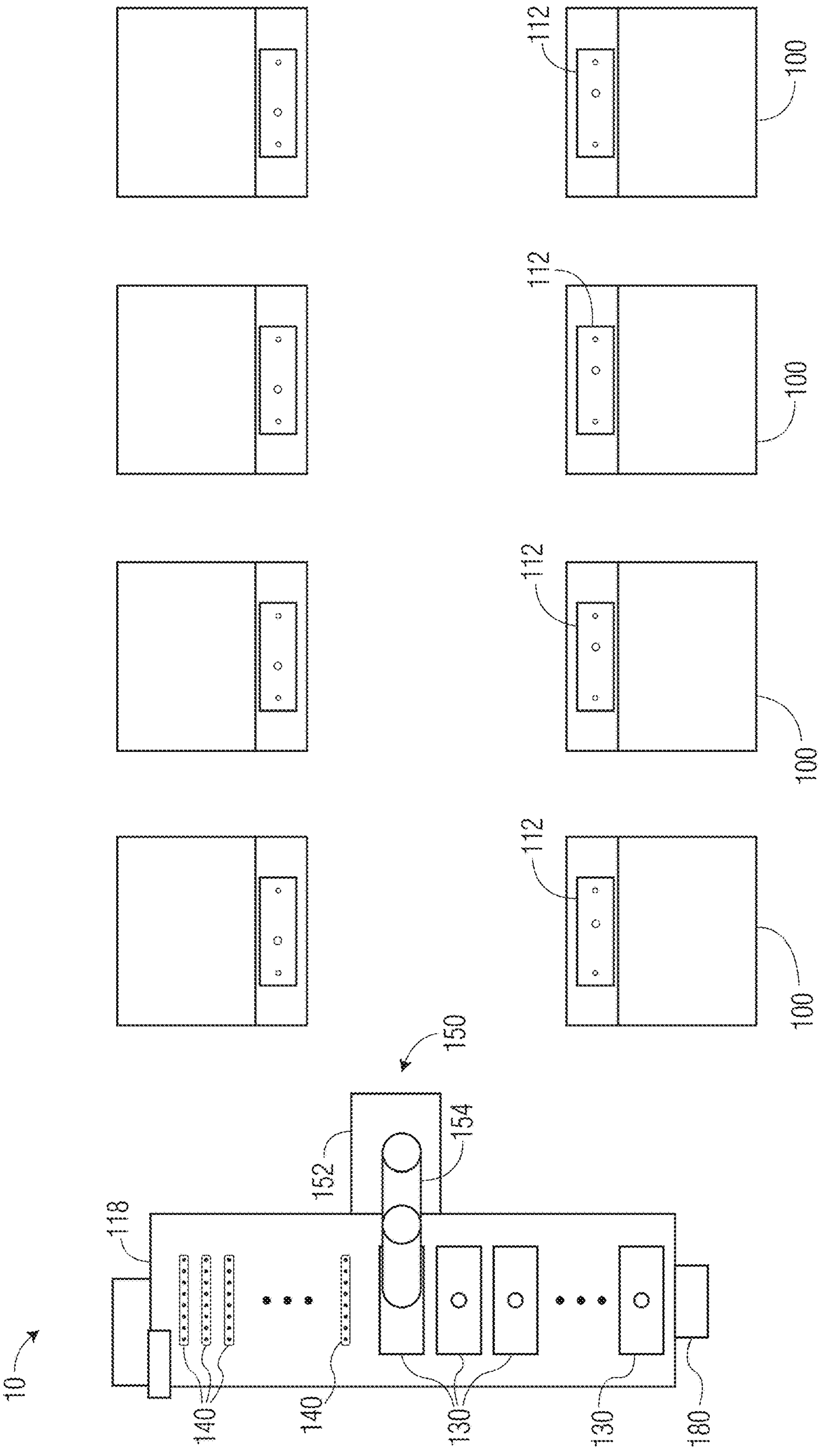
Figure 4C:
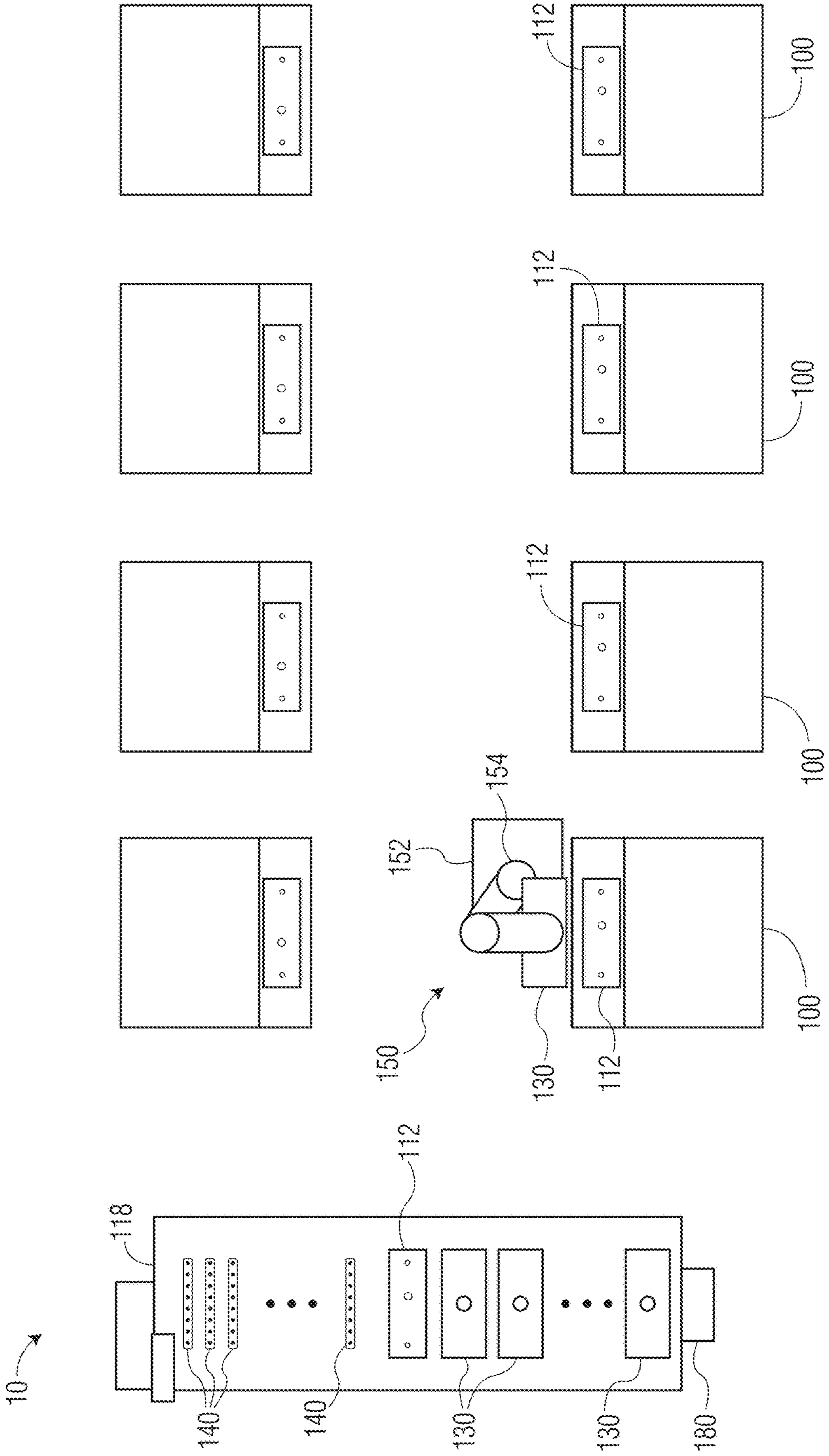

In FIG. 4B, service robot 150 has moved away from robot charging station 180. Service robot 150 is in the process of securing wire bonding tool replacement system 130 using robot arm 154 by gripping a handle of wire bonding tool replacement system 130 (e.g., handle 130*c* of FIGS. 1B and 1C). In FIG. 4C, service robot 150 has moved with wire bonding tool replacement system 130 to a position adjacent to one of the plurality of wire bonding systems 100. Service robot 150 is aligning wire bonding tool replacement system 130 with docking station 112 of wire bonding system 100. It is contemplated that service robot 150 may carry wire bonding tool replacement system 130 in any way during transit (e.g., by gripping handle 130*c* during transit, by placing wire bonding tool replacement system 130 on robot base 152 during transit, etc.). In FIG. 4C, the removal of wire bonding tool replacement system 130 has exposed a docking station 112 of maintenance station 118. Maintenance station 118 includes a plurality of docking stations 112 that may correspond to the number of wire bonding tool replacement systems 130. Each of the plurality of docking stations 112 of maintenance station 118 may be configured to receive each of the wire bonding tool replacement systems 130. Each of the plurality of docking stations 112 of maintenance station 118 may include connections for power and/or data to facilitate communication between each of the plurality of wire bonding tool replacement systems 130 and a computer included in wire bonding array 10.

Figure 4D:
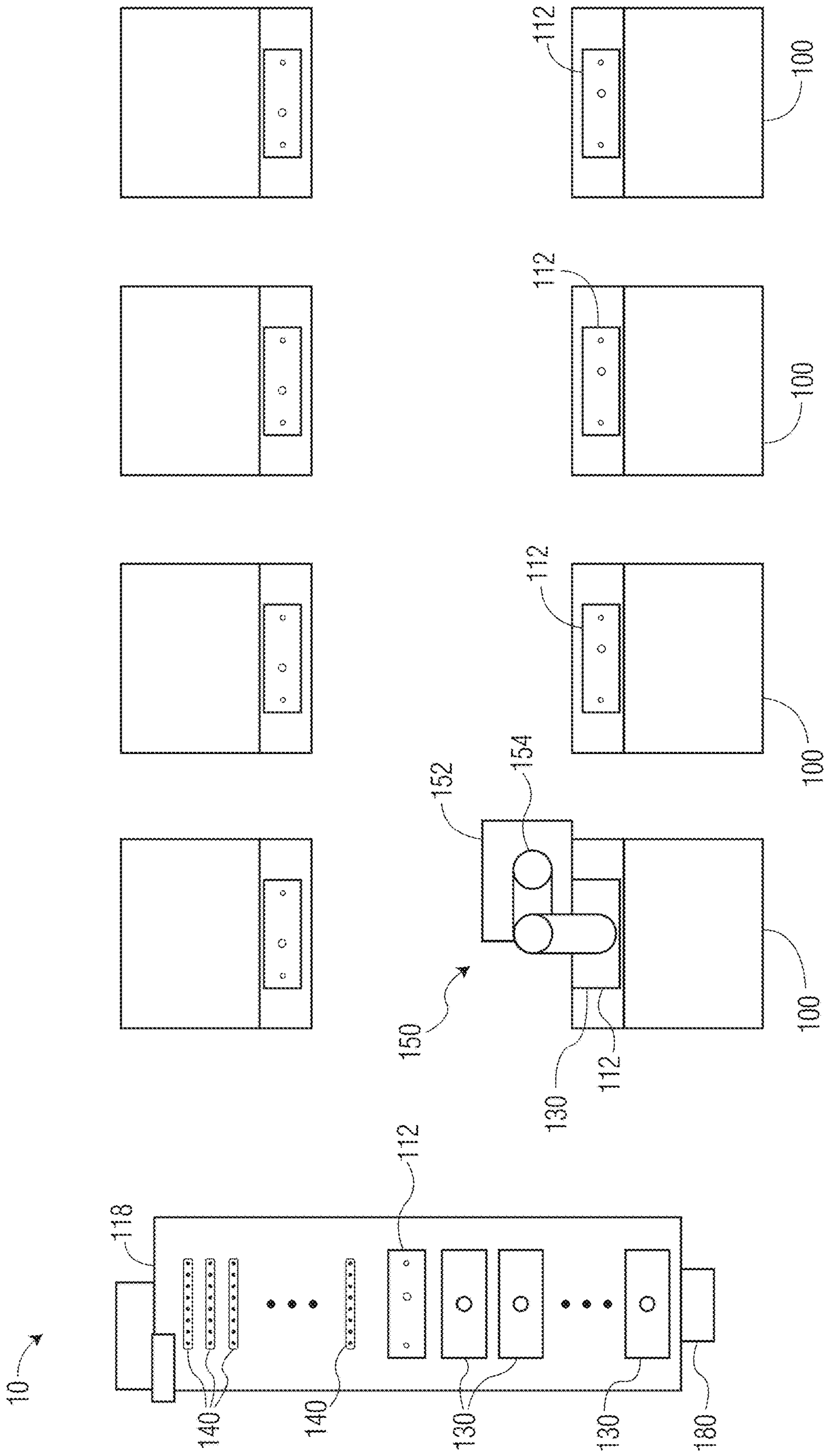
Figure 4E:
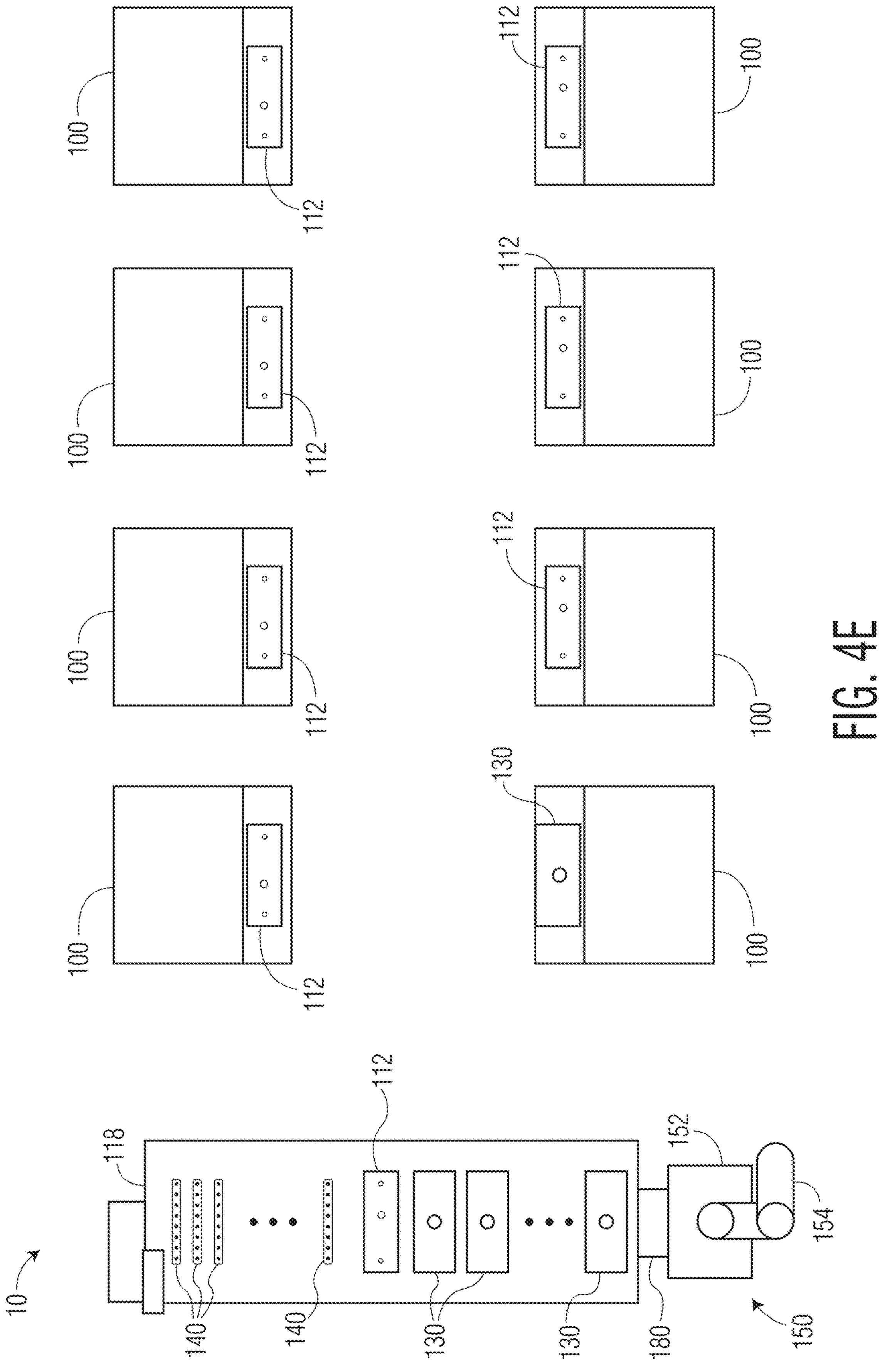

In FIG. 4D, service robot 150 is installing wire bonding tool replacement system 130 onto docking station 112 of wire bonding system 100. In FIG. 4E, wire bonding tool replacement system 130 has been installed on docking station 112 of wire bonding system 100, and service robot 150 has returned to robot charging station 180. Wire bonding tool replacement system 130 can begin the wire bonding tool replacement operation (i.e., the process of replacing the wire bonding tool installed on the wire bonding system with a different wire bonding tool 106).

Figure 5A:
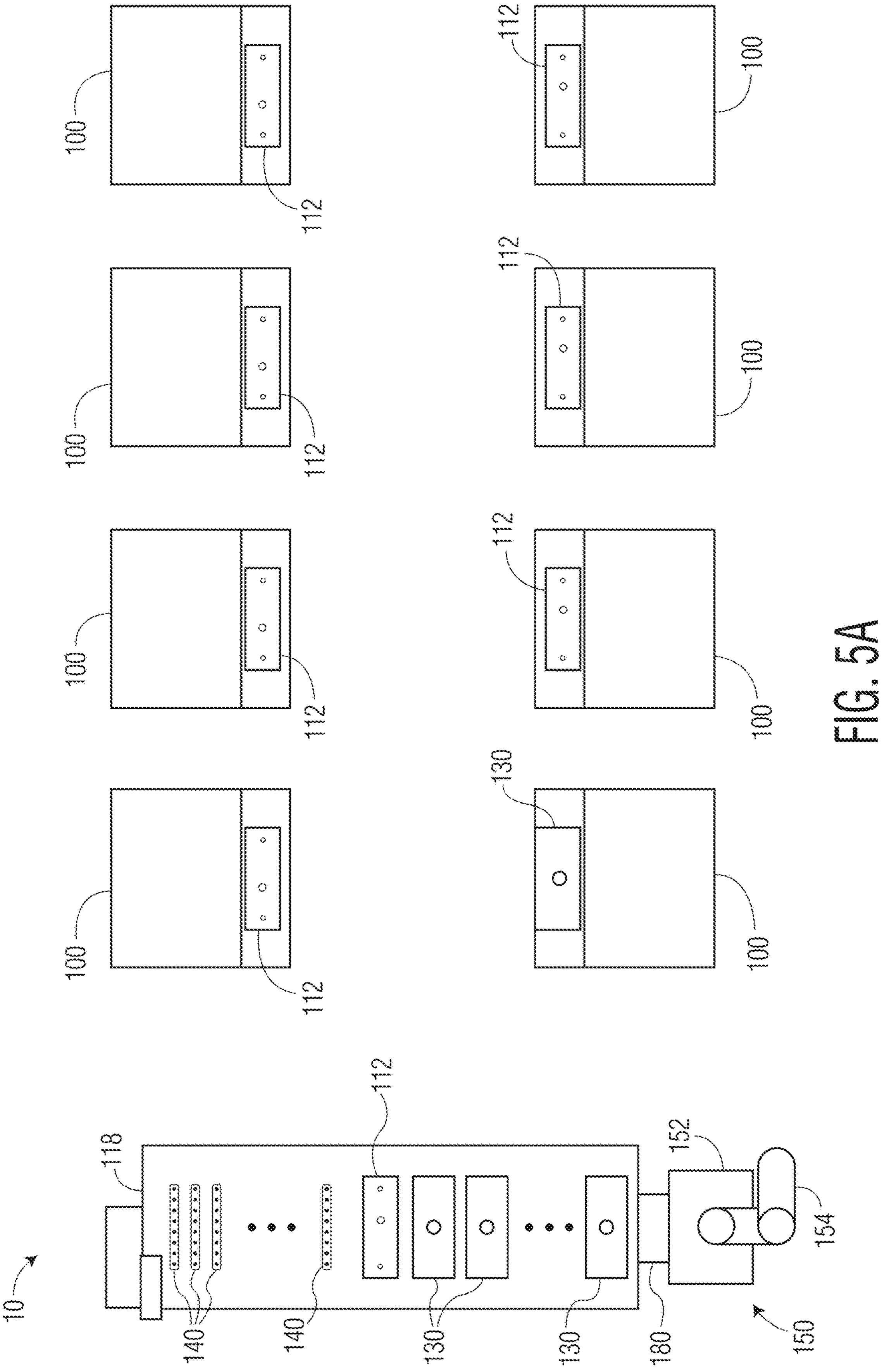
FIGS. 5A-5E are block diagrams of the wire bonding array of FIGS. 4A-4E illustrating another method of servicing the wire bonding array in accordance with another exemplary embodiment of the invention.
Figure 5B:
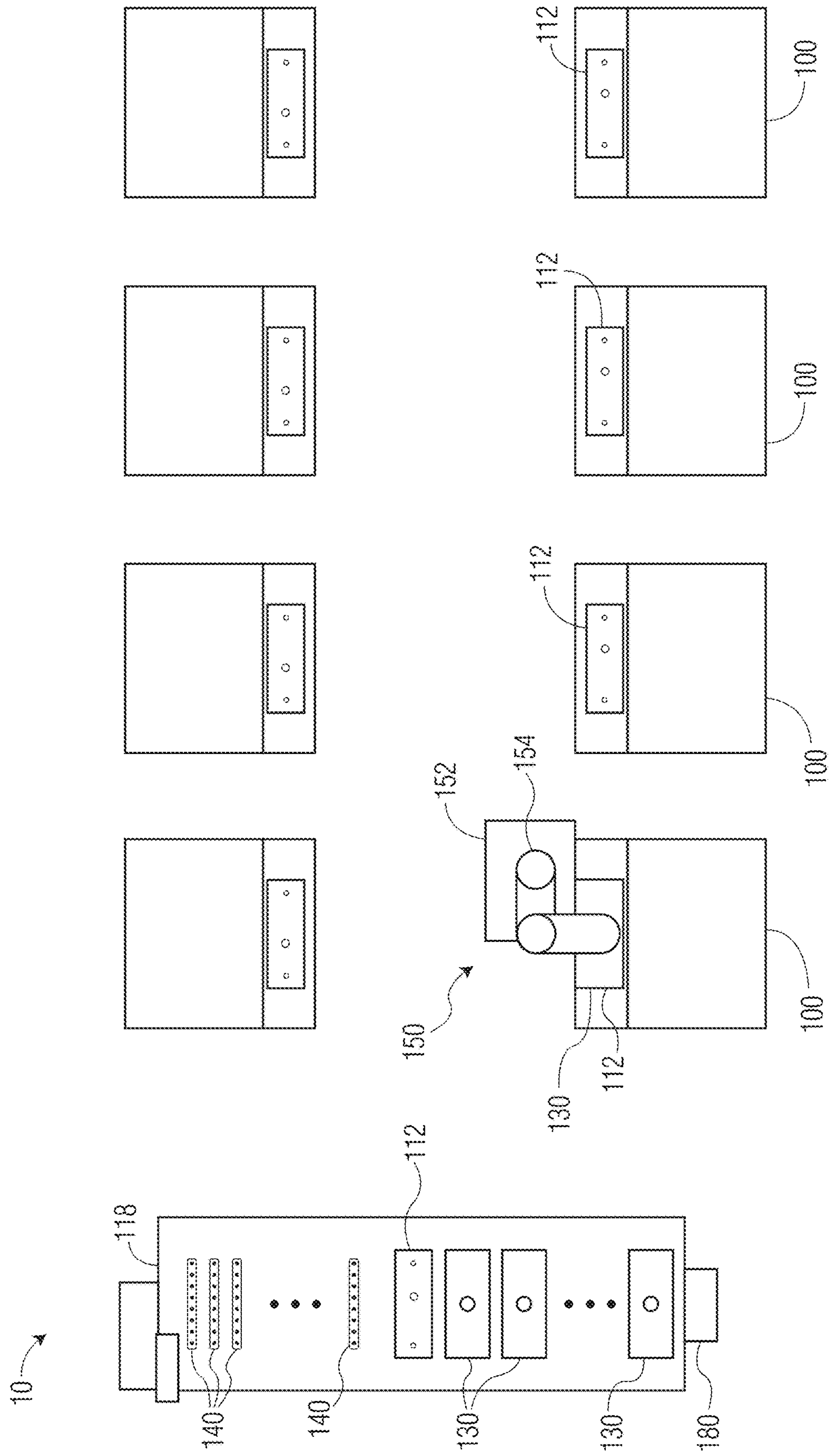
Figure 5C:
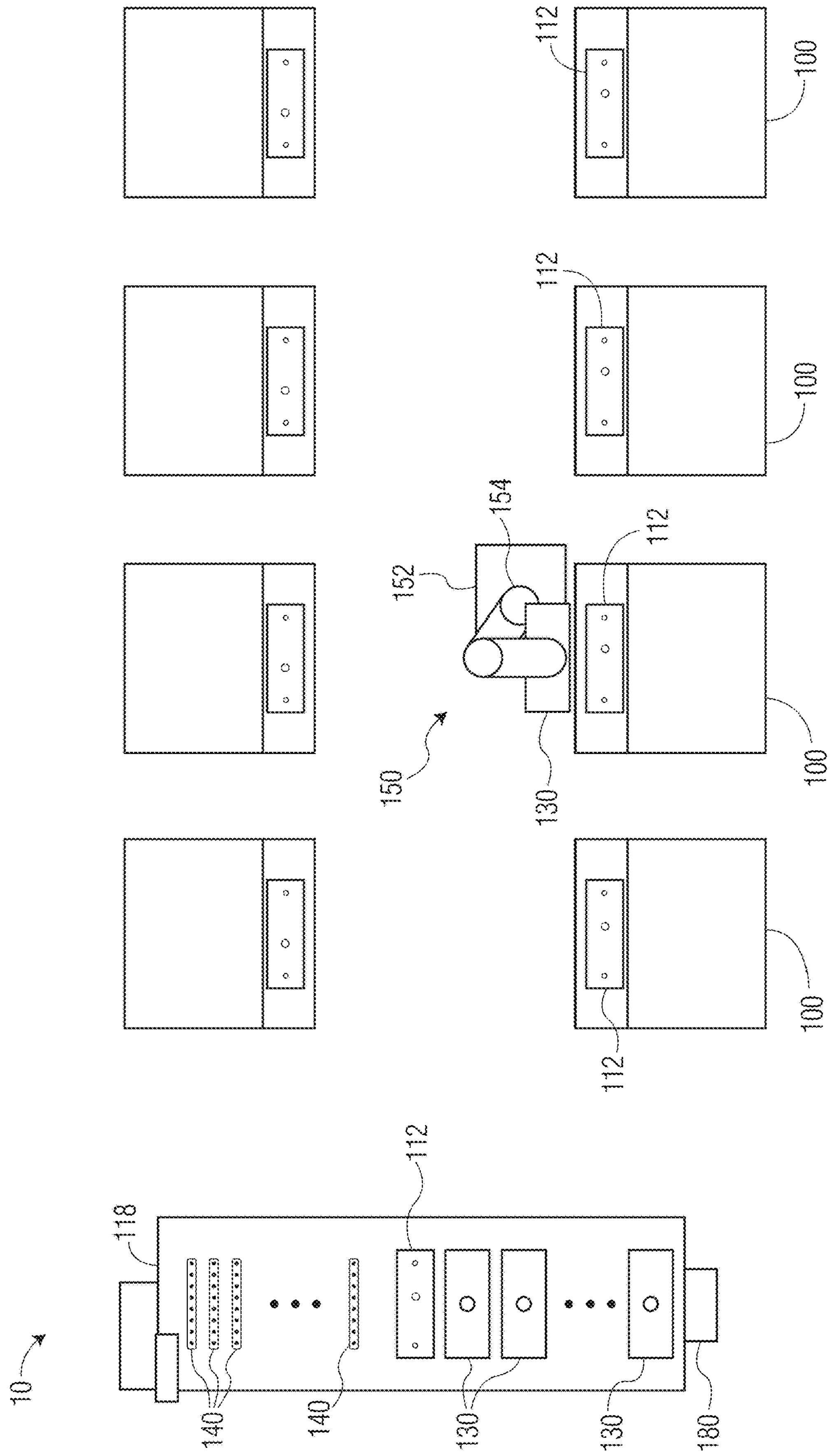
Figure 5D:
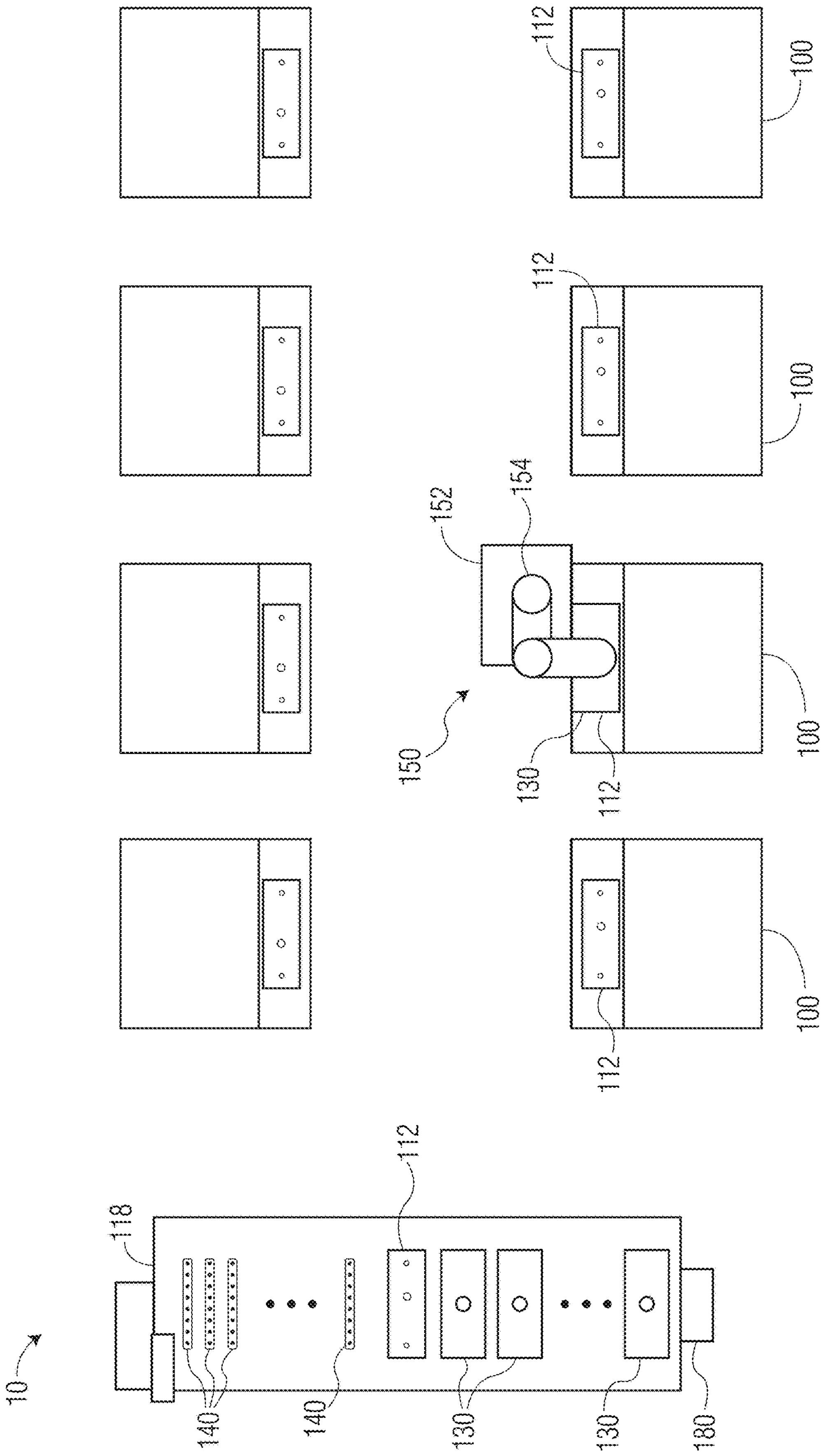
Figure 5E:
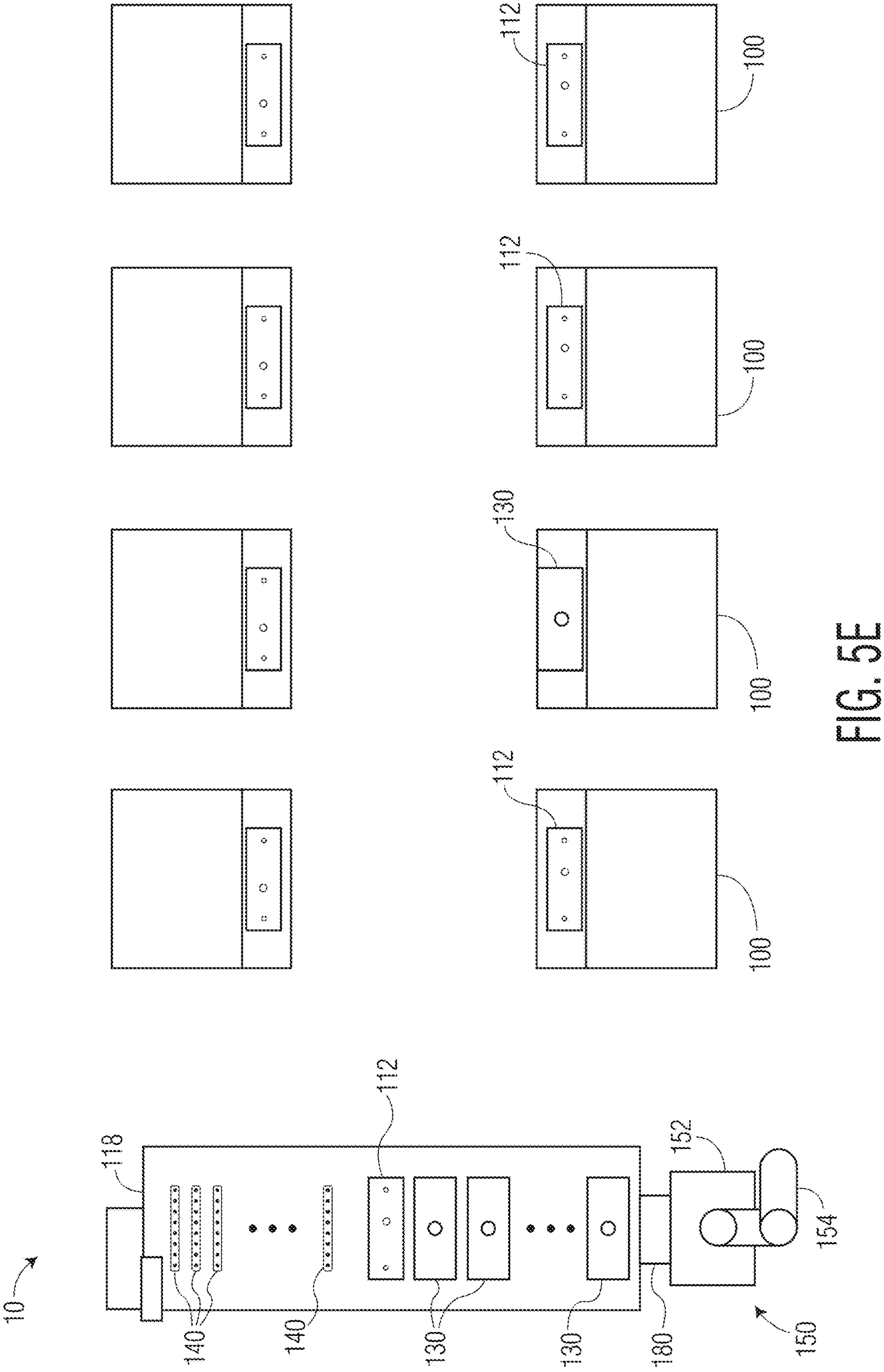

FIG. 5A illustrates wire bonding array 10 in the same state as FIG. 4E. However, in FIG. 5A, wire bonding tool replacement system 130 that was placed on wire bonding system 100 has completed the replacement of the wire bonding tool and is ready to be removed. Additionally, another of the plurality of wire bonding systems 100 requires replacement of its wire bonding tool. FIG. 5B illustrates service robot 150 securing wire bonding tool replacement system 130 with robot arm 154. FIG. 5C illustrates service robot 150 aligning wire bonding tool replacement system 130 with the another of the plurality of wire bonding systems 100. In FIG. 5D, service robot 150 is installing wire bonding tool replacement system 130 onto docking station 112 of the another of the plurality of wire bonding systems 100. In FIG. 5E, wire bonding tool replacement system 130 has been installed on docking station 112 of the another of the plurality of wire bonding systems 100, and service robot 150 has returned to robot charging station 180. Wire bonding tool replacement system 130 can begin the wire bonding tool replacement.

Figure 6A:
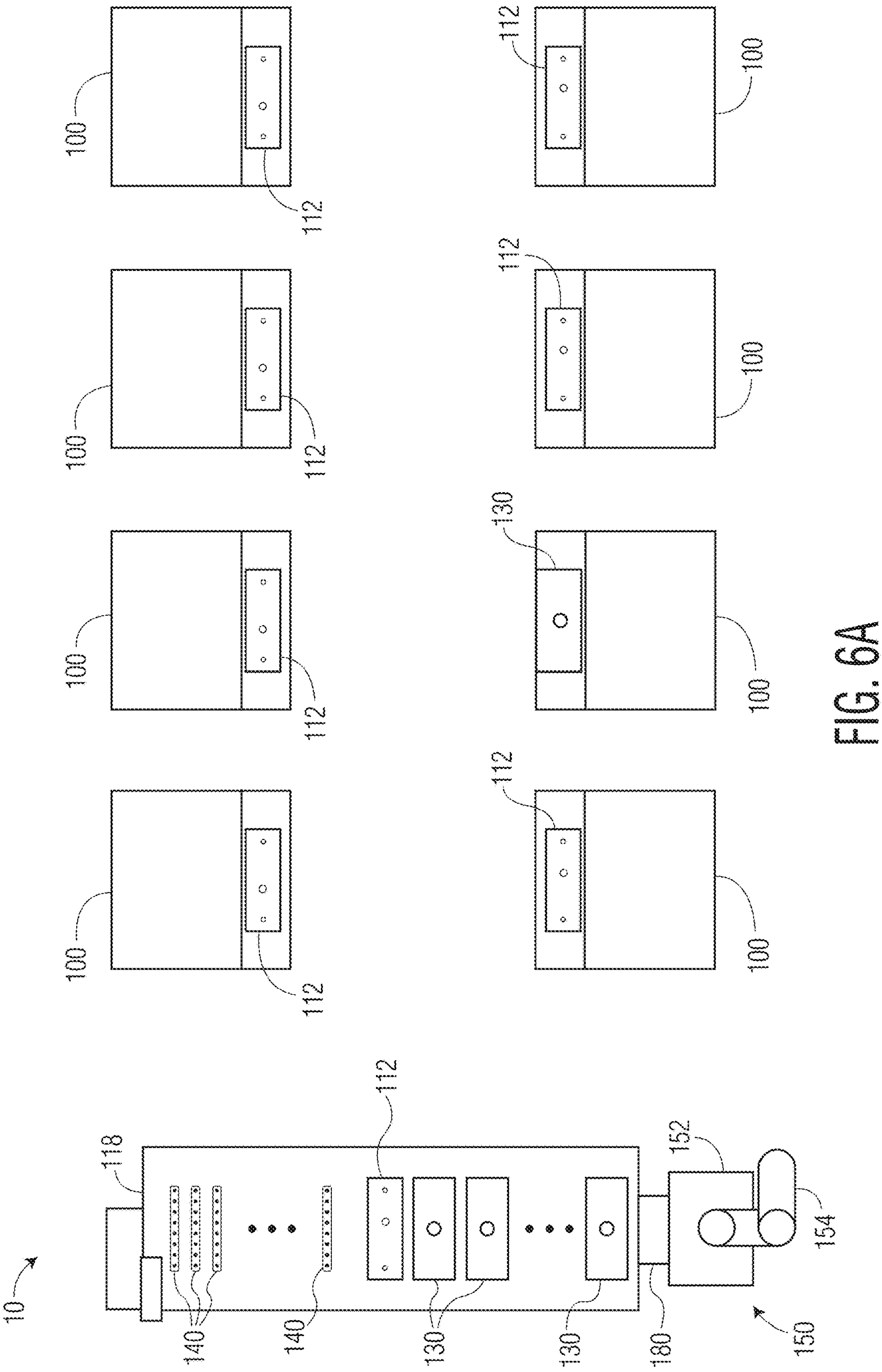
FIGS. 6A-6D are block diagrams of the wire bonding array of FIGS. 4A-4E illustrating another method of servicing the wire bonding array in accordance with another exemplary embodiment of the invention.
Figure 6B:
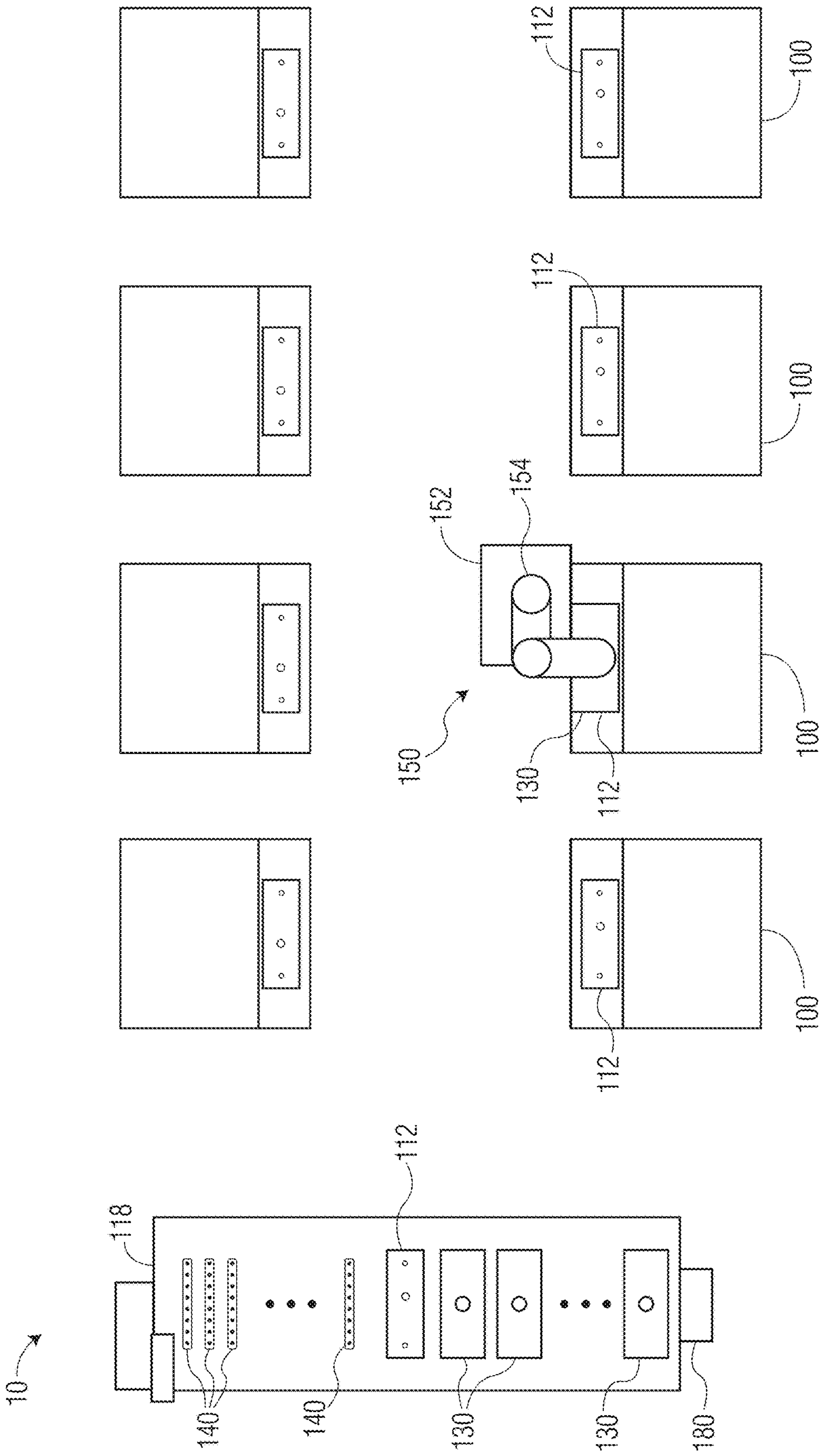
Figure 6C:
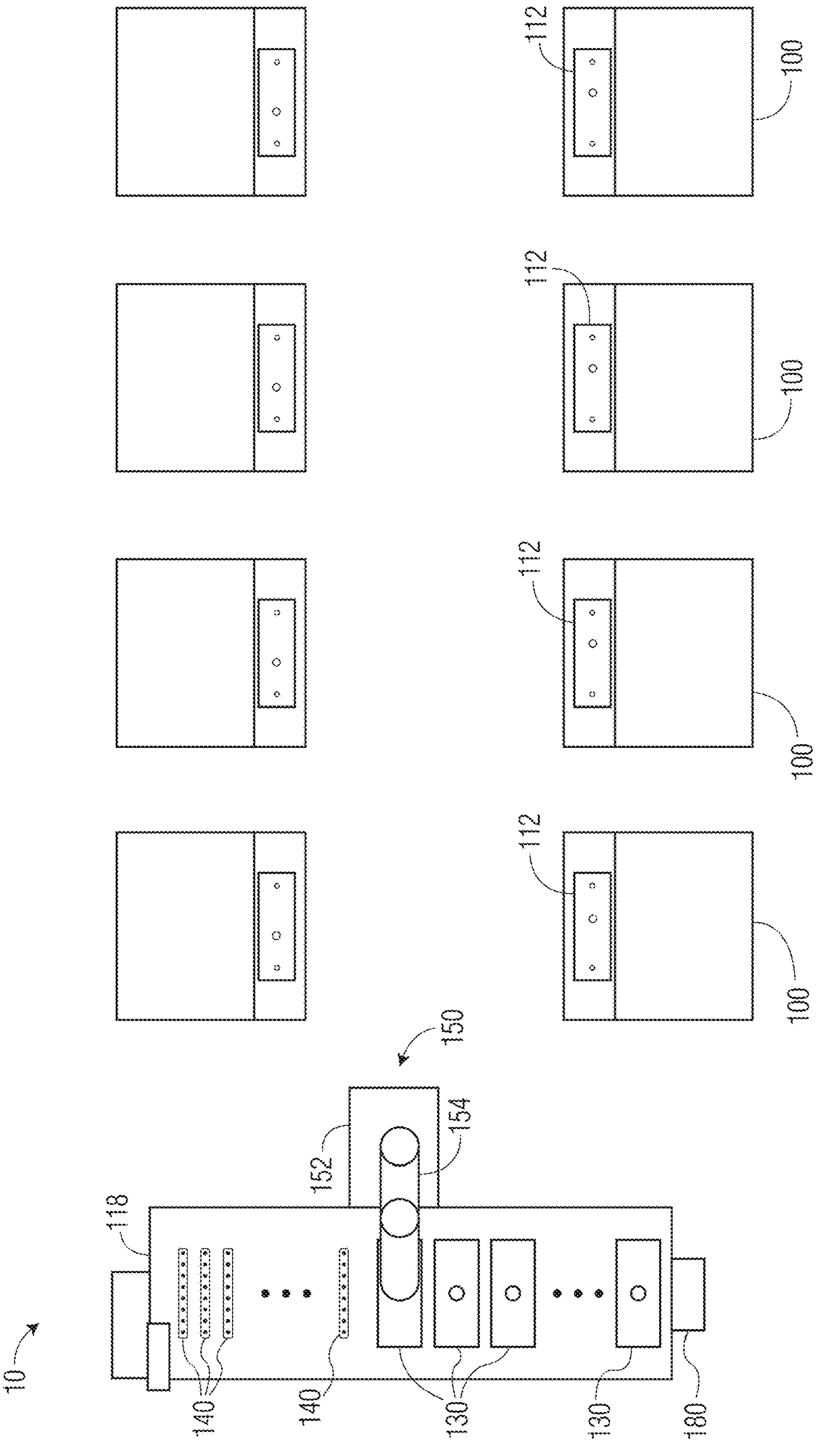
Figure 6D:
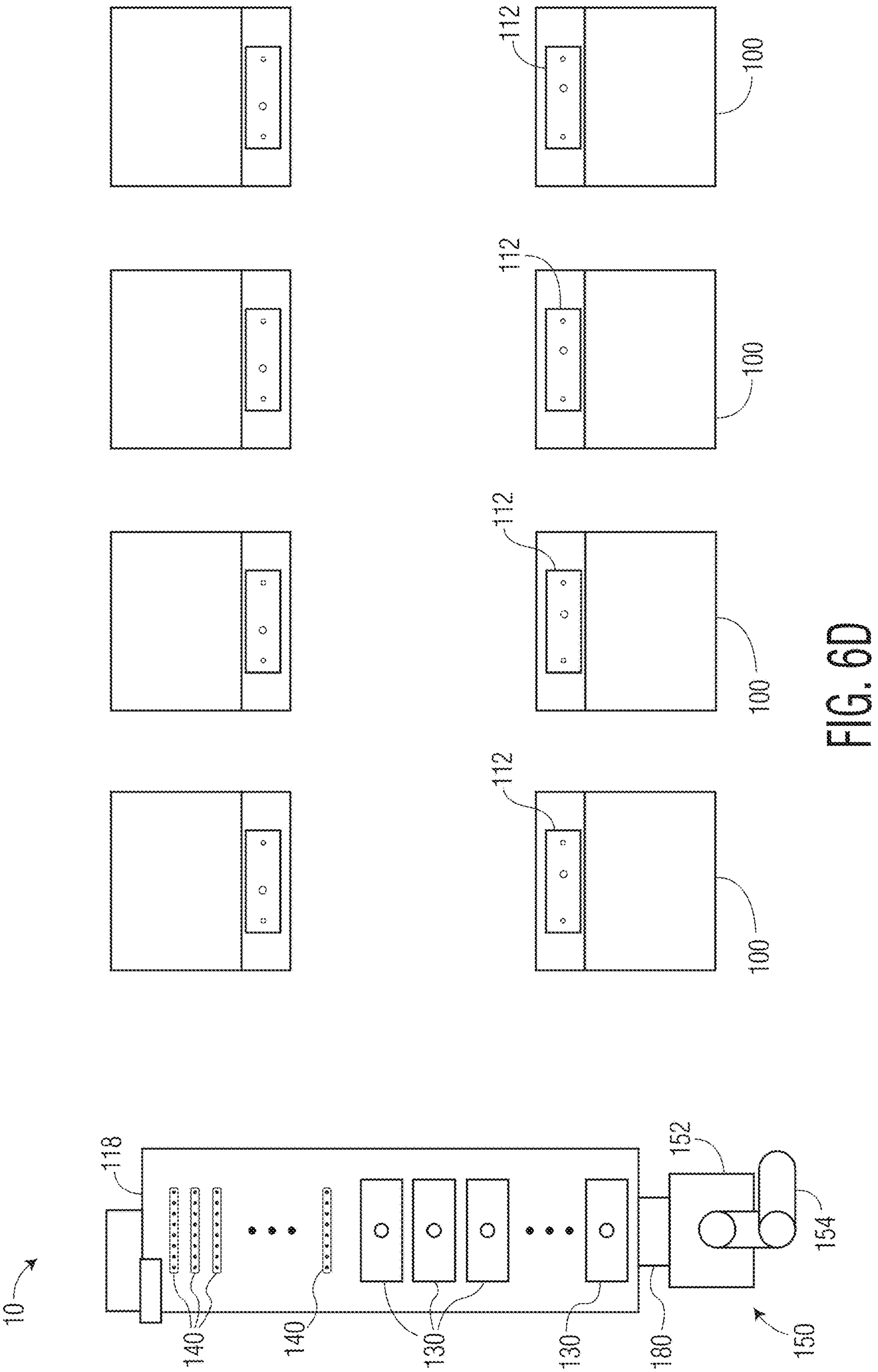

FIG. 6A illustrates wire bonding array 10 in the same state as FIG. 5E. However, wire bonding tool replacement system 130 has completed the replacement of the wire bonding tool and is ready to be removed. FIG. 6B illustrates service robot 150 securing wire bonding tool replacement system 130 with robot arm 154. In FIG. 6C, service robot 150 has removed wire bonding tool replacement system 130 from wire bonding system 100. Service robot 150 is placing wire bonding tool replacement system 130 on to docking station 112 of maintenance station 118. In FIG. 6D, wire bonding tool replacement system 130 has been returned to docking station 112 of maintenance station 118, and service robot 150 has returned to robot charging station 180. Wire bonding tool replacement system 130 can wait until another of the plurality of wire bonding systems 100 is ready for a wire bonding tool change, or it can be serviced by maintenance station 118 (e.g., see FIGS. 9A-9H, discussed in more detail herein).

Figure 7A:
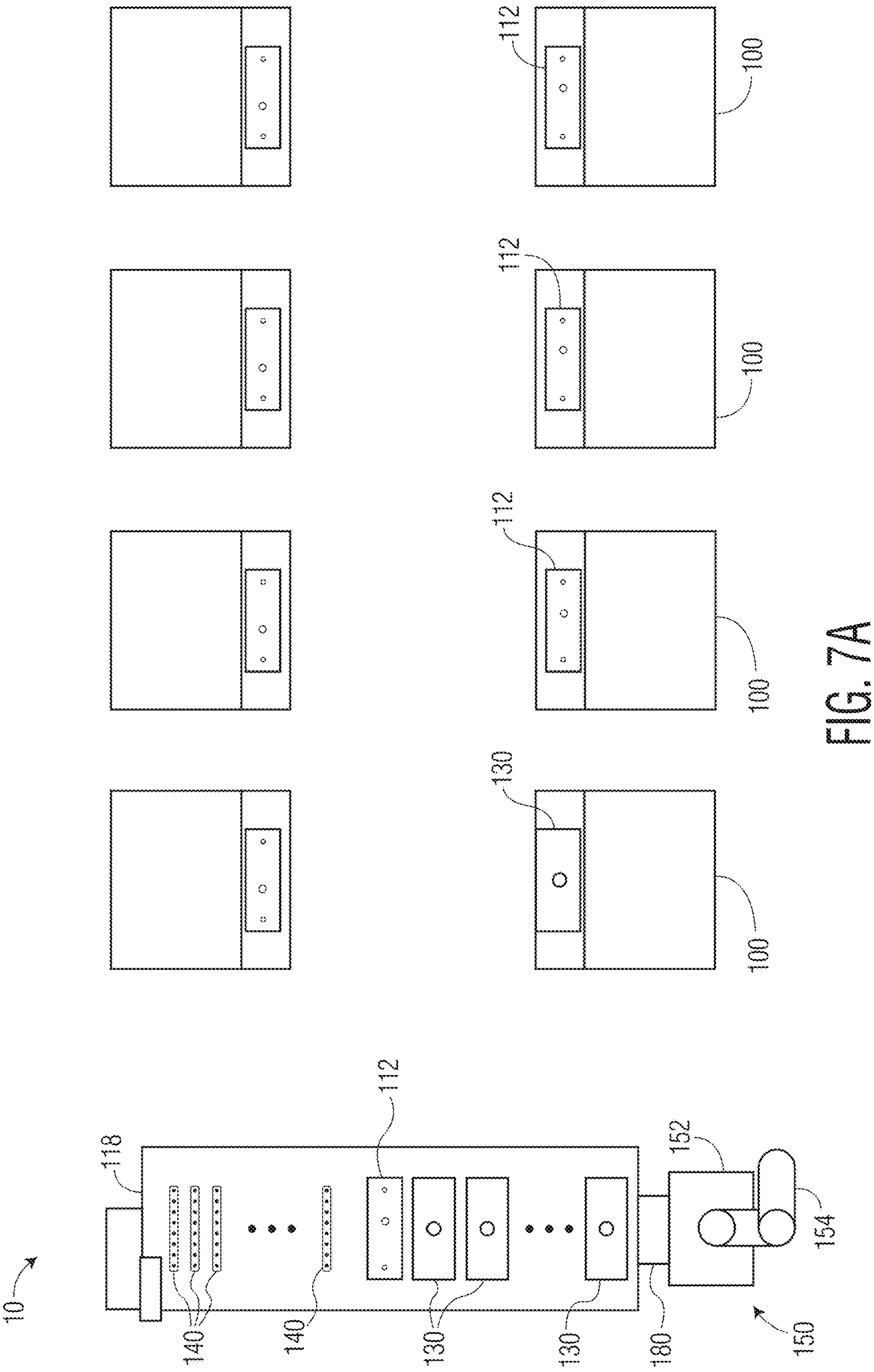
FIGS. 7A-7E are block diagrams of the wire bonding array of FIGS. 4A-4E illustrating another method of servicing the wire bonding array in accordance with another exemplary embodiment of the invention.
Figure 7B:
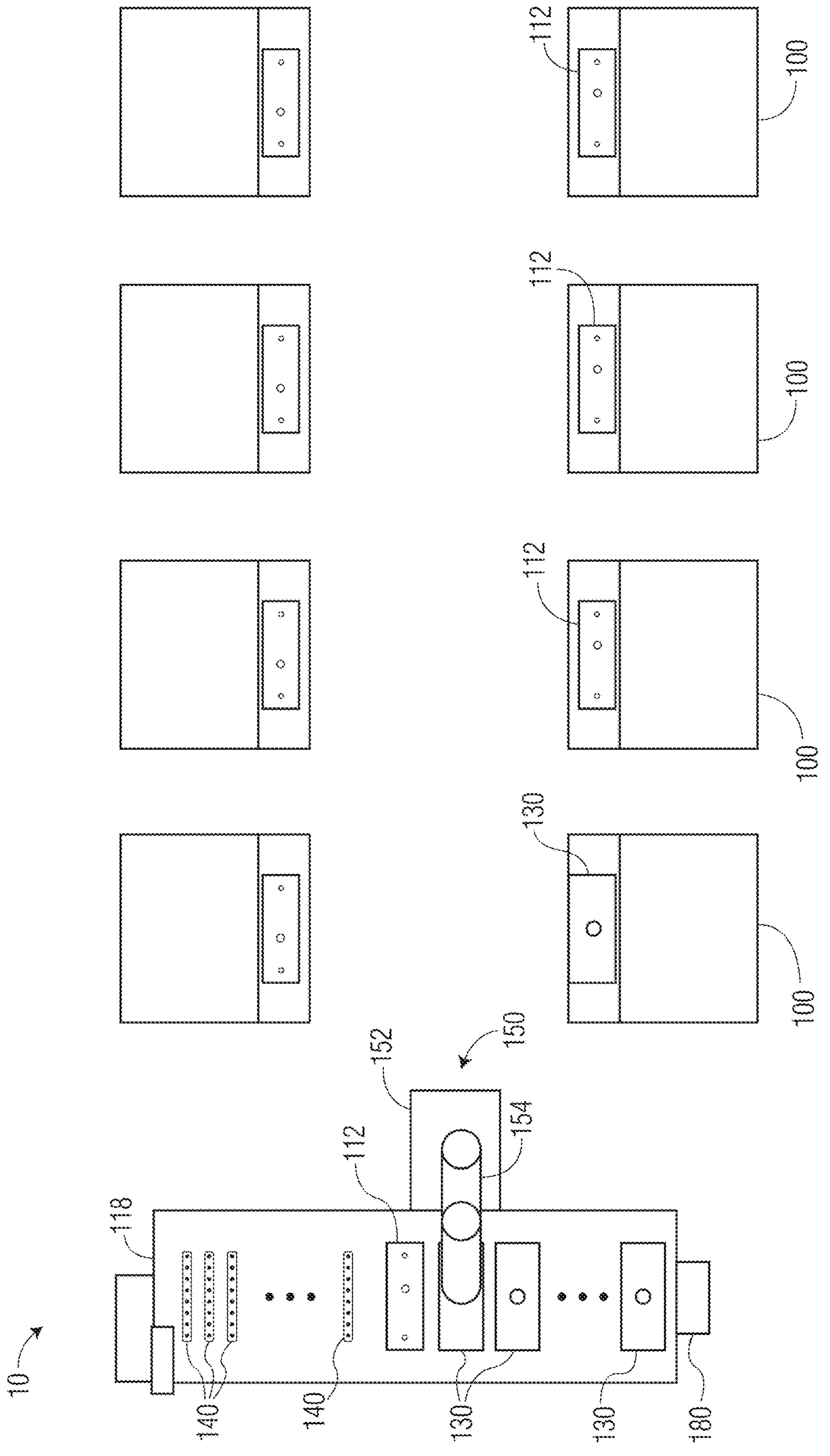
Figure 7C:
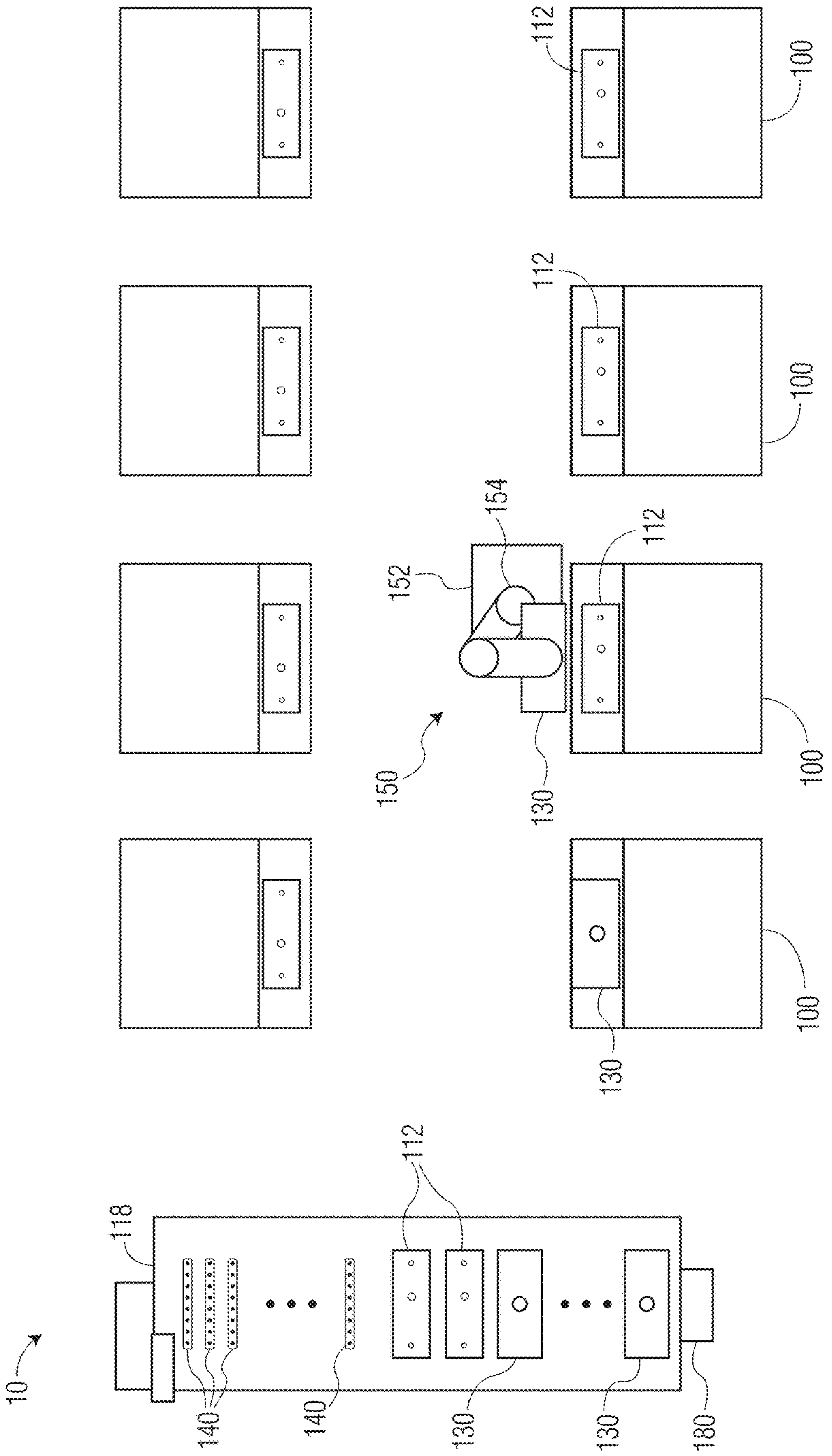
Figure 7D:
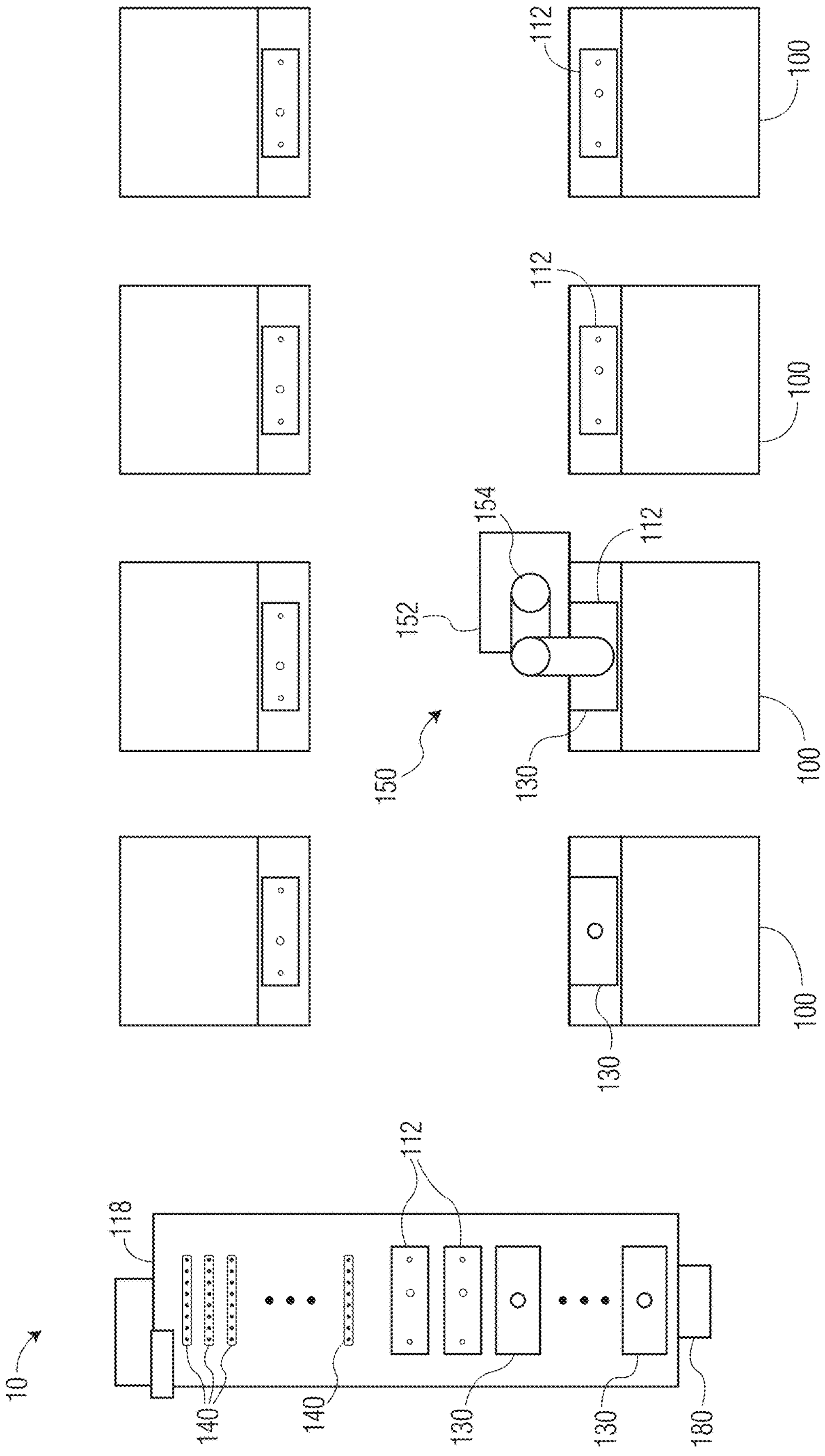
Figure 7E:
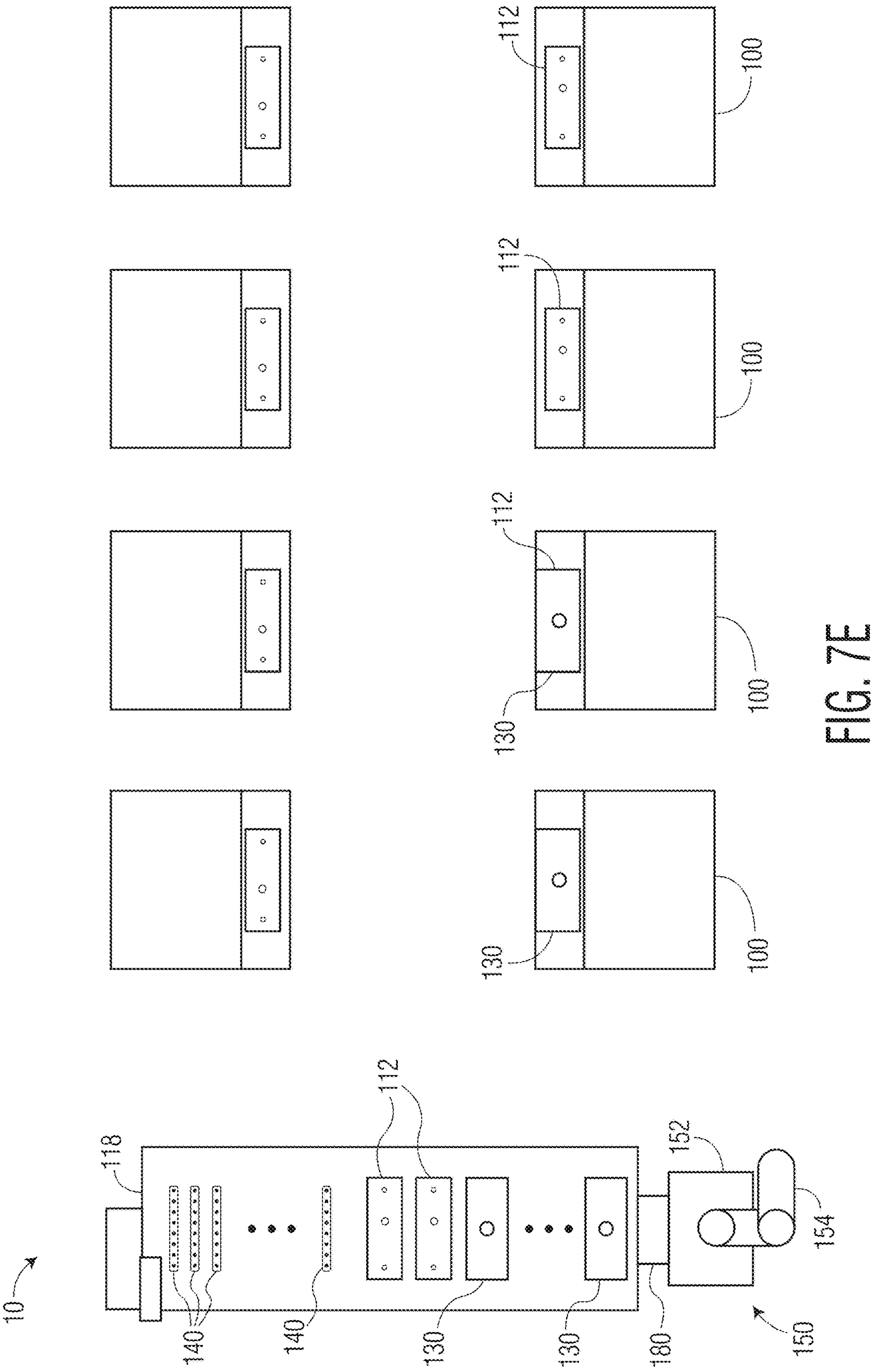

FIG. 7A illustrates wire bonding array 10 in the same state as FIG. 4E. However, wire bonding tool replacement system 130 has not yet finished replacing the wire bonding tool of wire bonding system 100. Further, another of the plurality of wire bonding systems 100 is ready to have its wire bonding tool replaced. In FIG. 7B, service robot 150 is securing another of the wire bonding tool replacement systems (i.e., wire bonding tool replacement system 130). FIG. 7C illustrates service robot 150 aligning wire bonding tool replacement system 130 with wire bonding system 100. In FIG. 7D, service robot 150 is installing wire bonding tool replacement system 130 onto docking station 112 of wire bonding system 100. In FIG. 7E, wire bonding tool replacement system 130 has been installed on wire bonding system 100, and service robot 150 has returned to robot charging station 180.

Although FIGS. 4A-4E, 5A-5E, 6A-6D, and 7A-7E illustrate a wire bonding array with a trackless service robot (e.g., where service robot 150 uses wheels, treads, etc. to move around wire bonding array 10), the invention is not limited to such. It is contemplated that a service robot on a track (e.g., a track in a factory floor, an elevated track, etc.) may be beneficial for reducing the footprint of a wire bonding array. For example, FIGS. 8A-8C illustrate various embodiments of the invention wherein the service robot travels along a track.

Figure 8A:
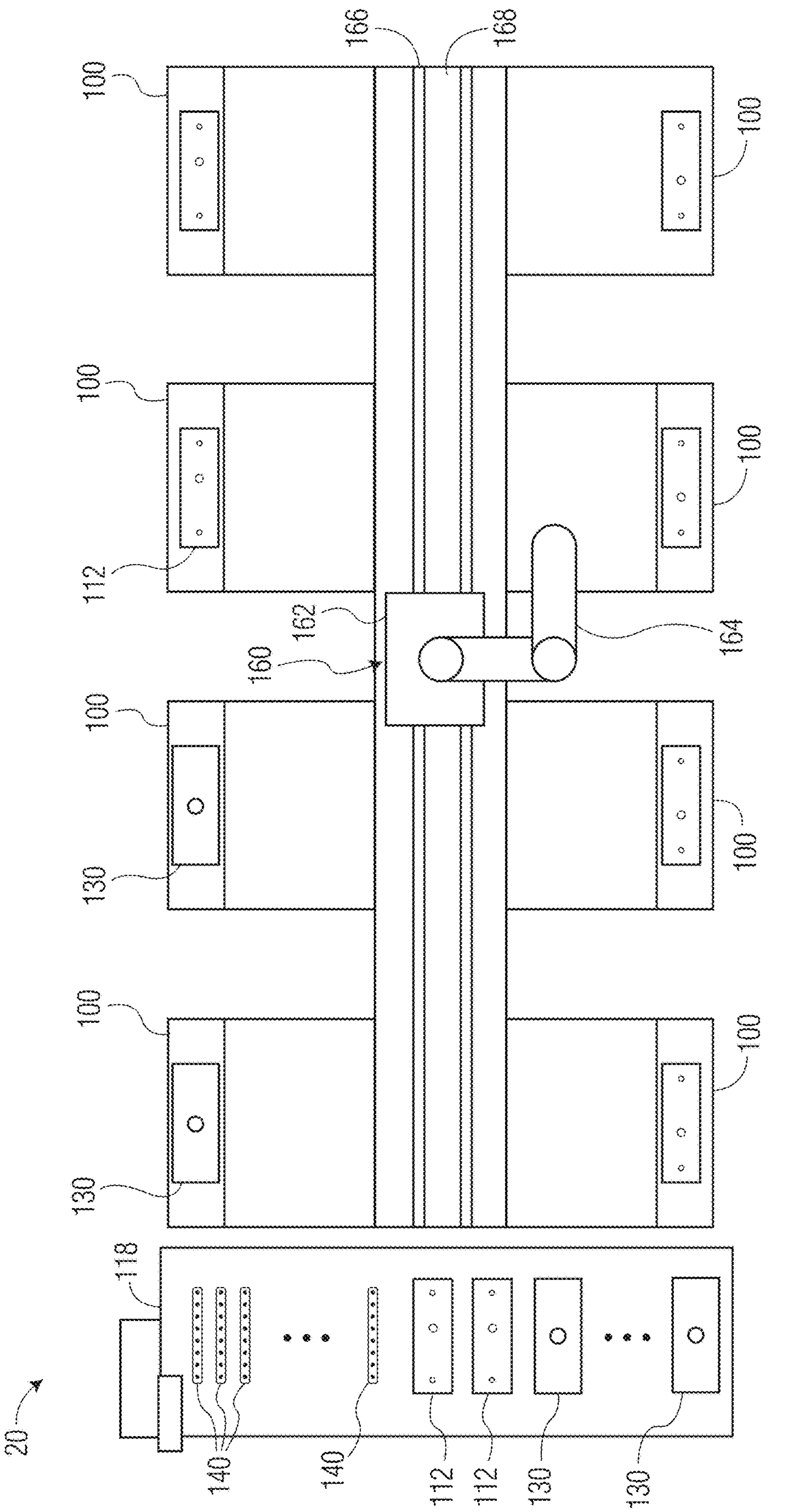
FIGS. 8A-8C are block diagrams of various wire bonding arrays in accordance with exemplary embodiments of the invention.

In particular, FIG. 8A illustrates an overhead view of an exemplary wire bonding array 20. Wire bonding array 20 includes a plurality of wire bonding systems 100, a robot support structure 168, and a maintenance station 118. Robot support structure 168 supports a service robot 160 on a track 166. Similar to service robot 150, service robot 160 includes a robot base 162 and a robot arm 164. Robot arm 164 is configured to engage handle 130*c* (e.g., see FIGS. 1B and 1C) in order to install wire bonding tool replacement system 130 on and/or remove wire bonding tool replacement system 130 from wire bonding system 100. Service robot 160 rides along track 166. Service robot 160 is configured to move at least one wire bonding tool replacement system 130 between each of the plurality of wire bonding systems 100 and maintenance station 118. Maintenance station 118 is described in additional detail herein.

Figure 8B:
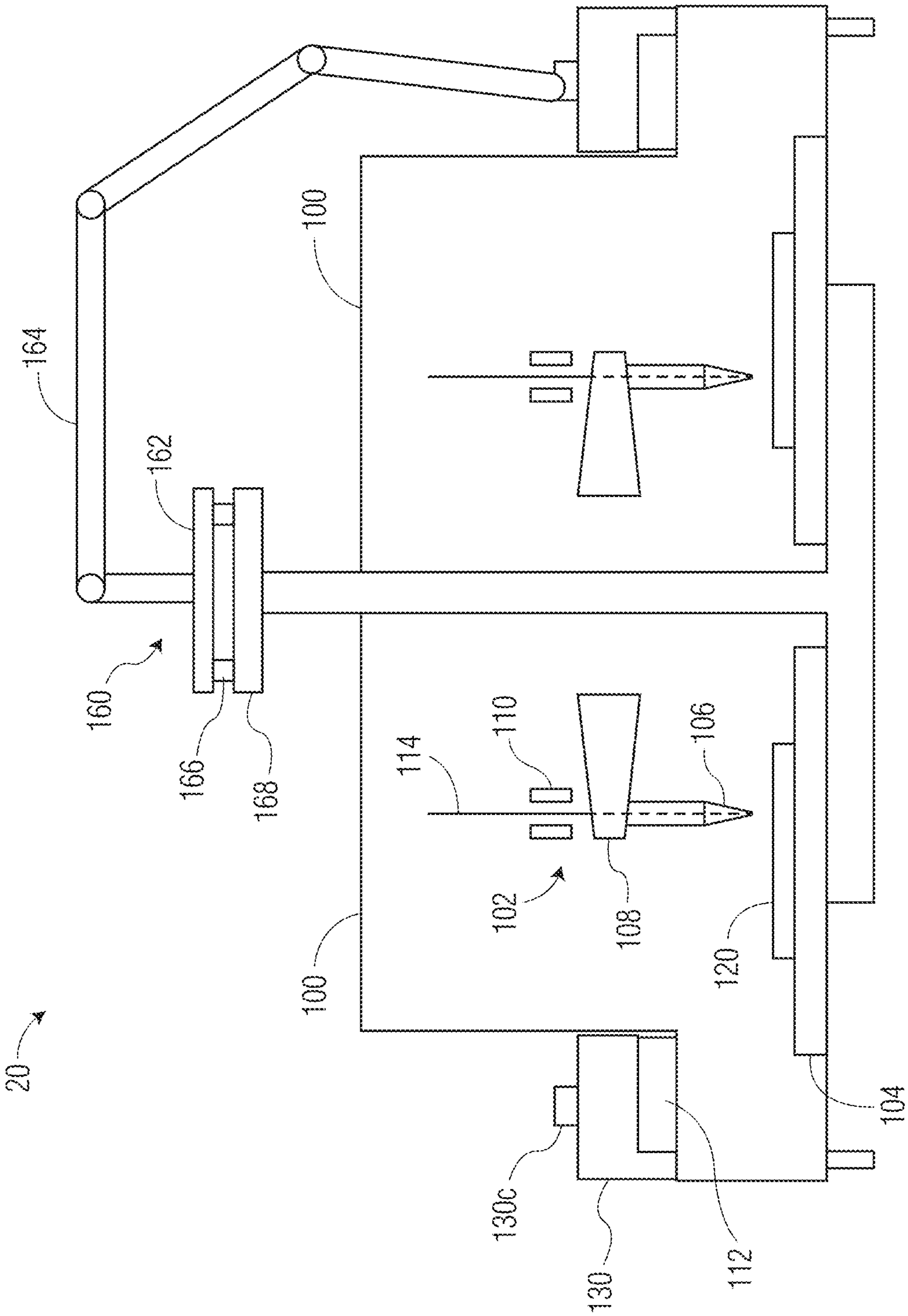
Figure 8C:
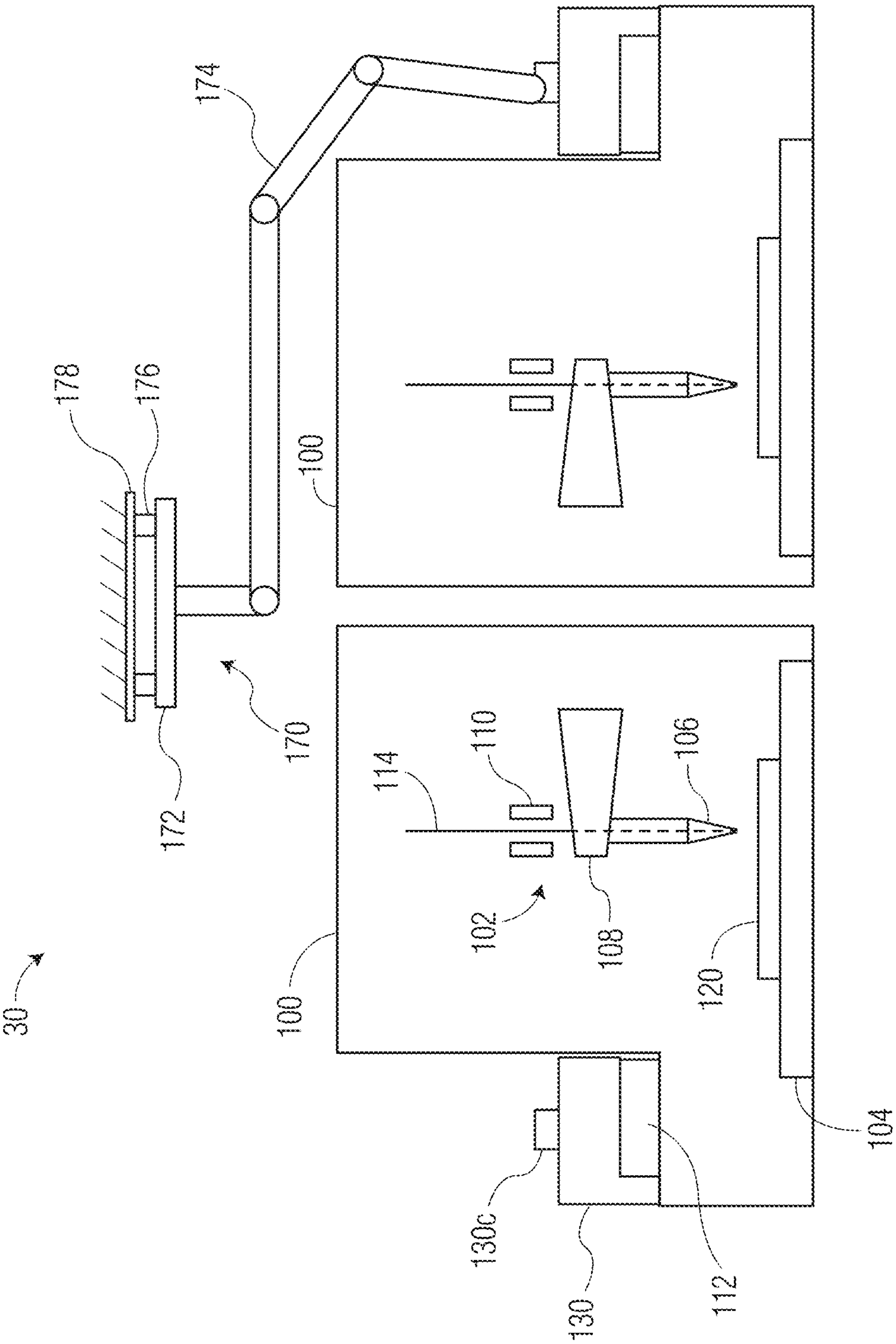

FIG. 8B illustrates a side view of wire bonding array 20. In particular, FIG. 8B illustrates that track 166 is elevated such that it supports robot base 162 above at least a portion of each of the plurality of wire bonding systems 100 (e.g., above docking station 112, or any other receiving portion configured to receive a wire bonding tool replacement system). In FIG. 8B, robot support structure 168 resembles an I-beam situated between wire bonding systems 100, which are arranged back-to-back (although the invention is not limited to a back-to-back arrangement). By elevating service robot 160, it is possible to arrange the plurality of wire bonding systems 100 such that there is a minimal amount of space between each of the plurality of wire bonding systems 100. Maintenance station 118 may also be placed in closer proximity to the plurality of wire bonding systems 100.

It is further contemplated that the space between each of the plurality of wire bonding systems 100 can be further reduced by suspending the robot support structure above the plurality of wire bonding systems 100. FIG. 8C illustrates such a wire bonding array 30, including a plurality of wire bonding systems 100 and a robot support structure 178 including a track 176 that is suspended above the plurality of wire bonding systems 100 (e.g., suspended from a ceiling of a factory by cables, trusses, or other structure). Robot support structure 178 supports a service robot 170 that includes a robot base 172 and a robot arm 174 on track 176. Track 176 supports robot base 172 above at least a portion of each of the plurality of wire bonding systems 100 (e.g., above docking station 112, or any other receiving portion configured to receive a wire bonding tool replacement system). Wire bonding array 30 may also include a maintenance station (e.g., see maintenance station 118 in FIG. 8A). By suspending service robot 170 above the remainder of wire bonding array 30, each of the plurality of wire bonding systems 100 may be placed at a minimal distance from one another.

Although service robots 160 and 170 are illustrated and described as being supported by a track, the invention is not limited thereto. It is contemplated that a base of a service robot could be elevated and supported by any other structure, such as a cable or a plurality of cables, a gantry, a conveyor belt, a linear motor, a ball screw, etc.

As wire bonding tool replacement systems serve the wire bonding array, they use up their supply of new wire bonding tools and collect used wire bonding tools (e.g., see FIG. 3B). Once a wire bonding tool replacement system runs out of new wire bonding tools, it may be reloaded. Such reloading may be done manually by human operators, or may be done automatically (e.g., at the maintenance station). For example, once an empty wire bonding tool replacement system is returned to the maintenance station (e.g., installed on a docking station of the maintenance station by a service robot, as in FIGS. 6A-6D), a replacement assembly can (i) remove used wire bonding tools from the wire bonding tool replacement system, and/or (ii) provide new wire bonding tools to the wire bonding tool replacement system. FIGS. 9A-9H illustrate such a process.

Figure 9B:
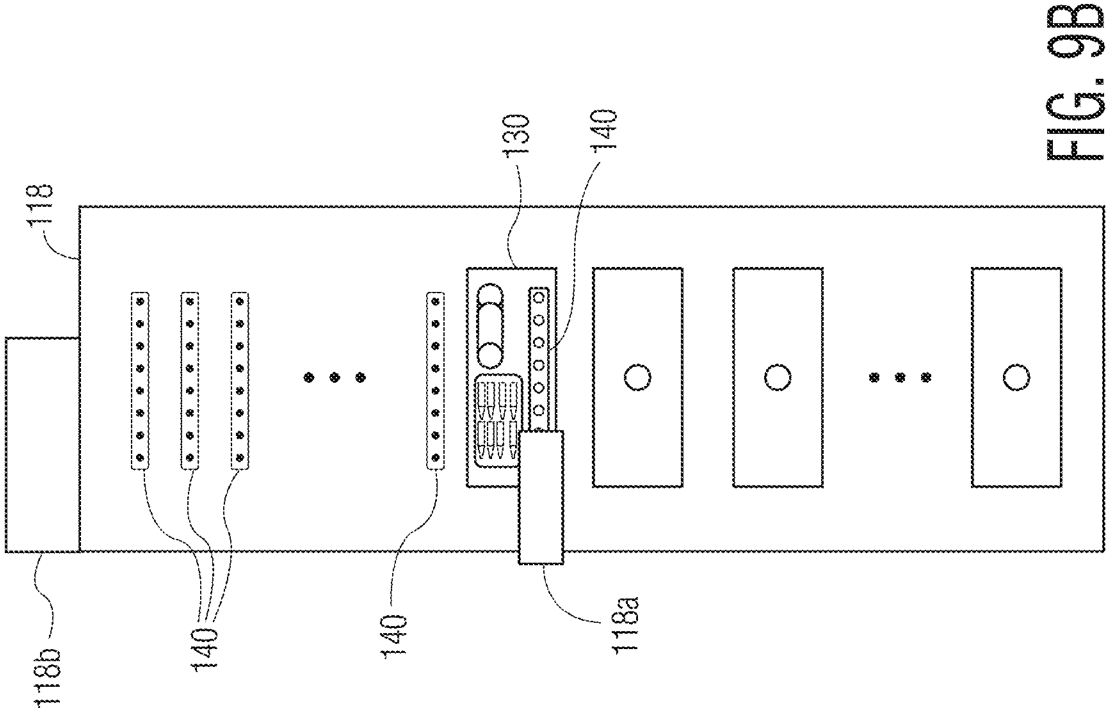
FIGS. 9A-9H are block diagrams of a maintenance station of a wire bonding array illustrating a method of operating the maintenance station in accordance with various exemplary embodiments of the invention.
Figure 9A:
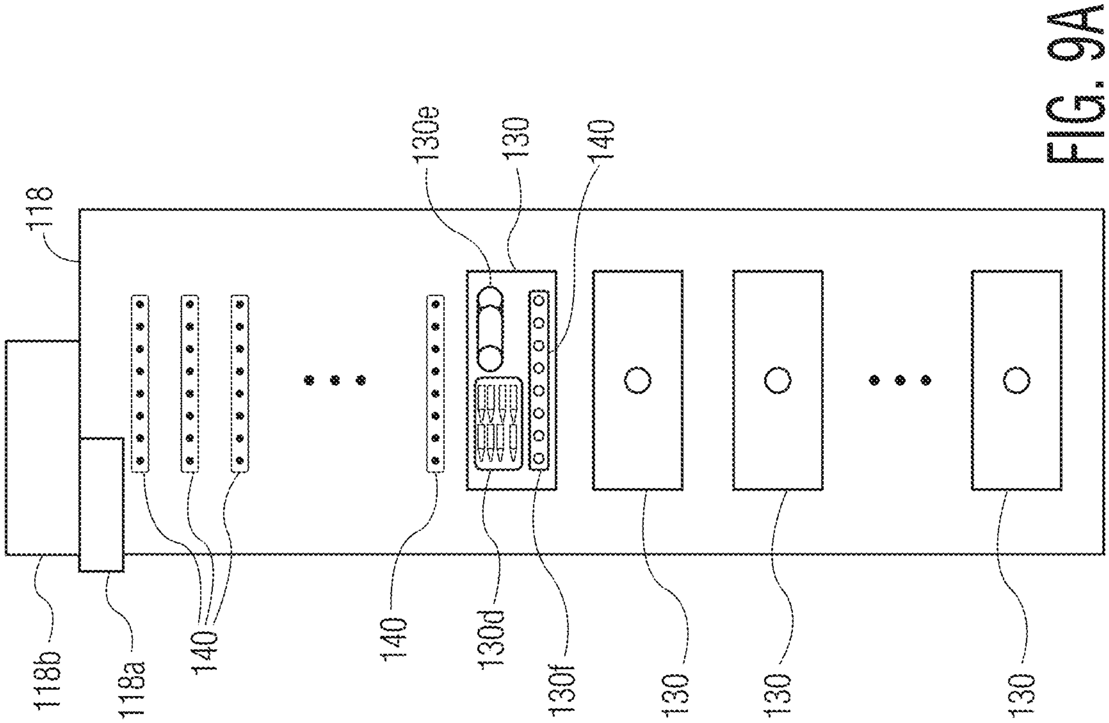

FIG. 9A illustrates maintenance station 118. Maintenance station 118 includes a plurality of wire bonding tool replacement systems 130, a plurality of wire bonding tool trays 140, a replacement assembly 118*a*, and a waste receptacle 118*b*. Each of the plurality of wire bonding tool replacement systems 130 is installed on one of a plurality of docking stations 112 (not illustrated). One of the wire bonding tool replacement systems 130 is illustrated in the "depleted" state (e.g., see FIG. 3B, described herein). Each of the plurality of wire bonding tool replacement systems 130 is configured for installation on, and removal from, a wire bonding system (e.g., see FIGS. 1B, 1C, 2A, 2B, and 4A-4E). Each of the plurality of wire bonding tool trays 140 includes a plurality of wire bonding tools 106.

Replacement assembly 118*a* is configured to remove waste from each of the plurality of wire bonding tool replacement systems 130. Such waste may include (i) used wire bonding tools 106' that are stored in used wire bonding tool receptacle 130*d*, and/or (ii) an empty wire bonding tool tray 140. Replacement assembly 118*a* may include a gripper, a clamp, a suction device, or other structure known in the art for selectively moving items.

Figure 9D:
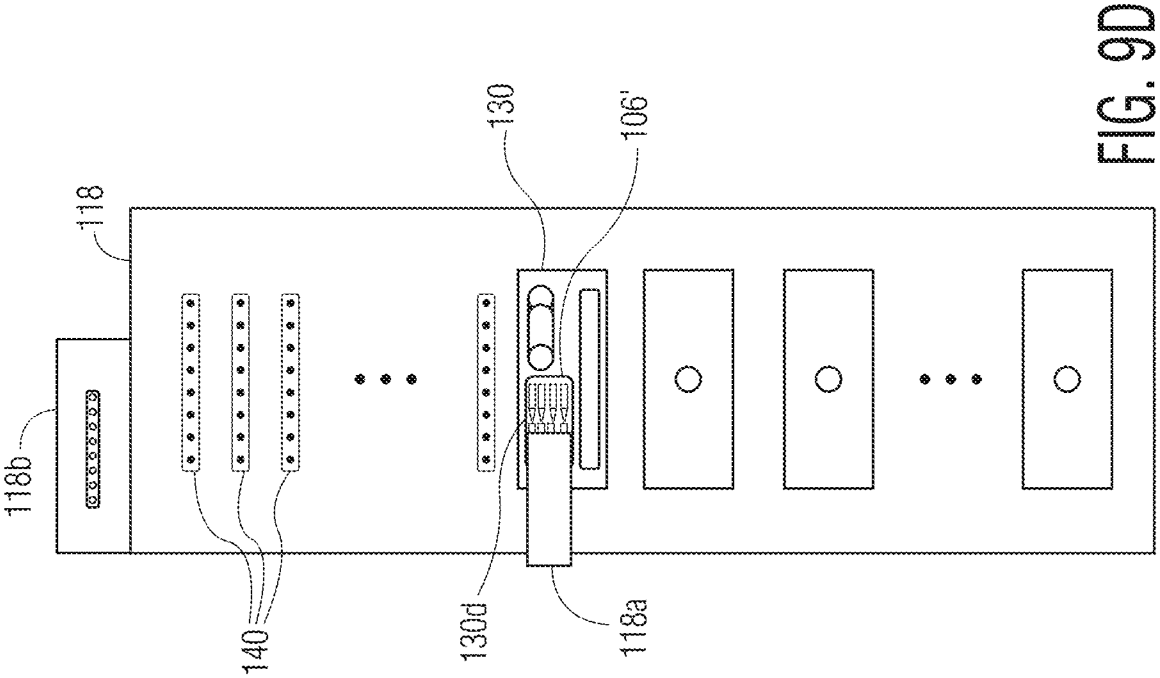
Figure 9C:
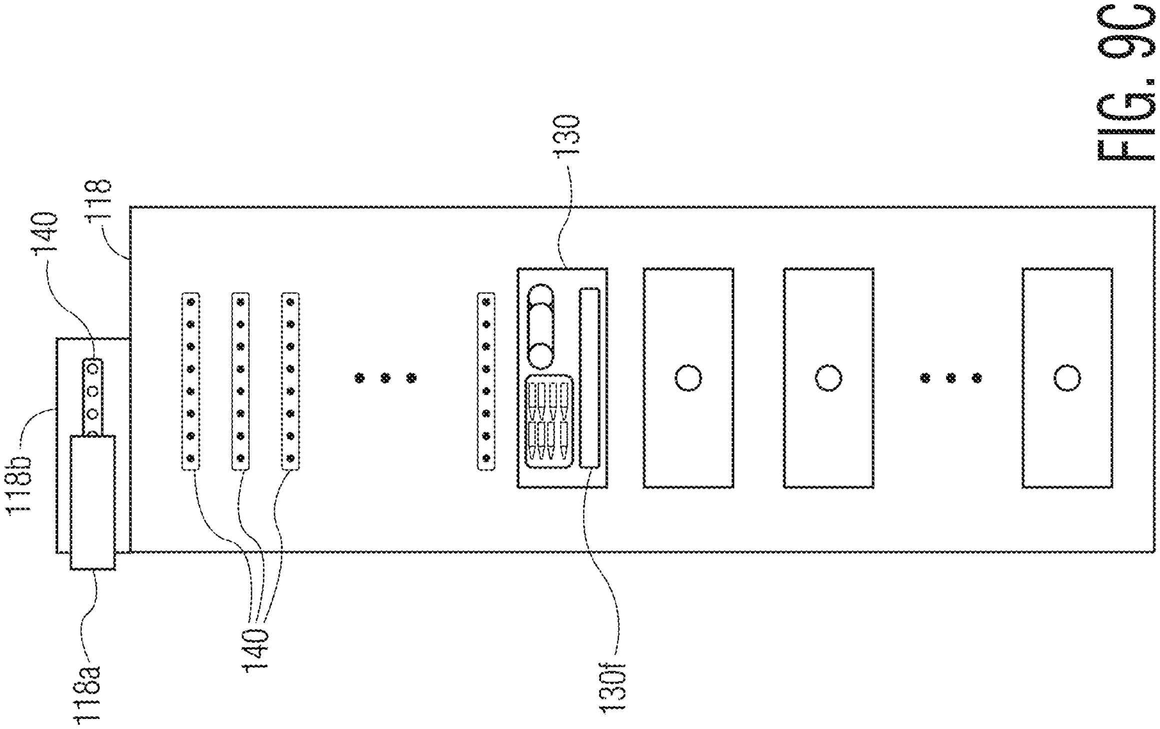
Figure 9F:
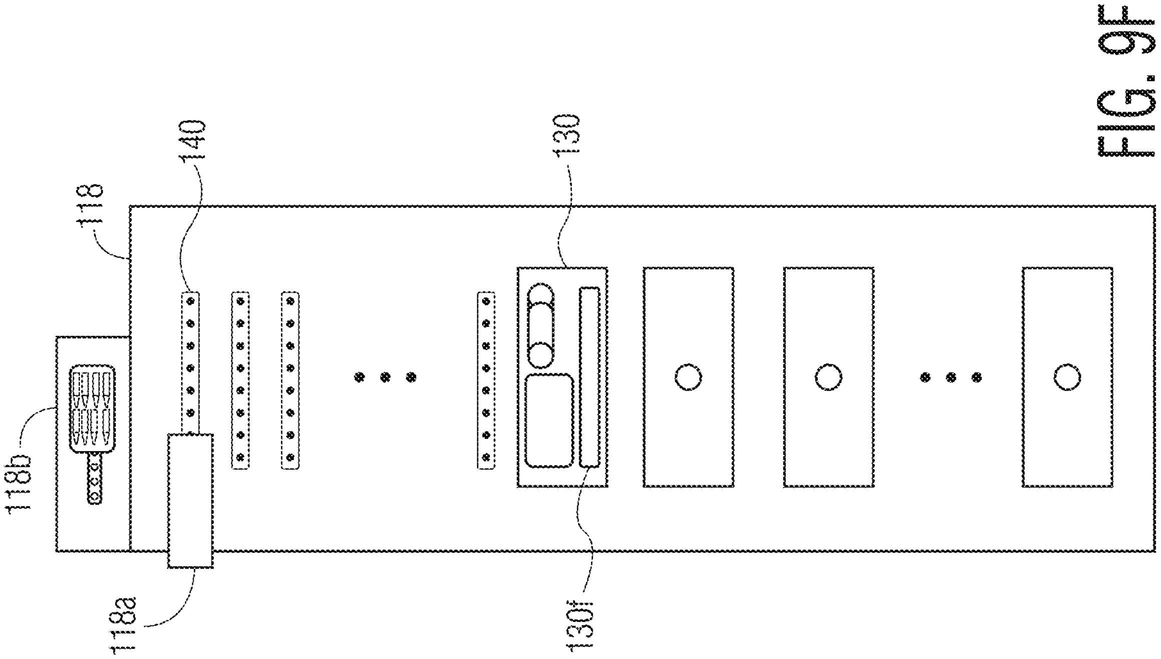
Figure 9E:
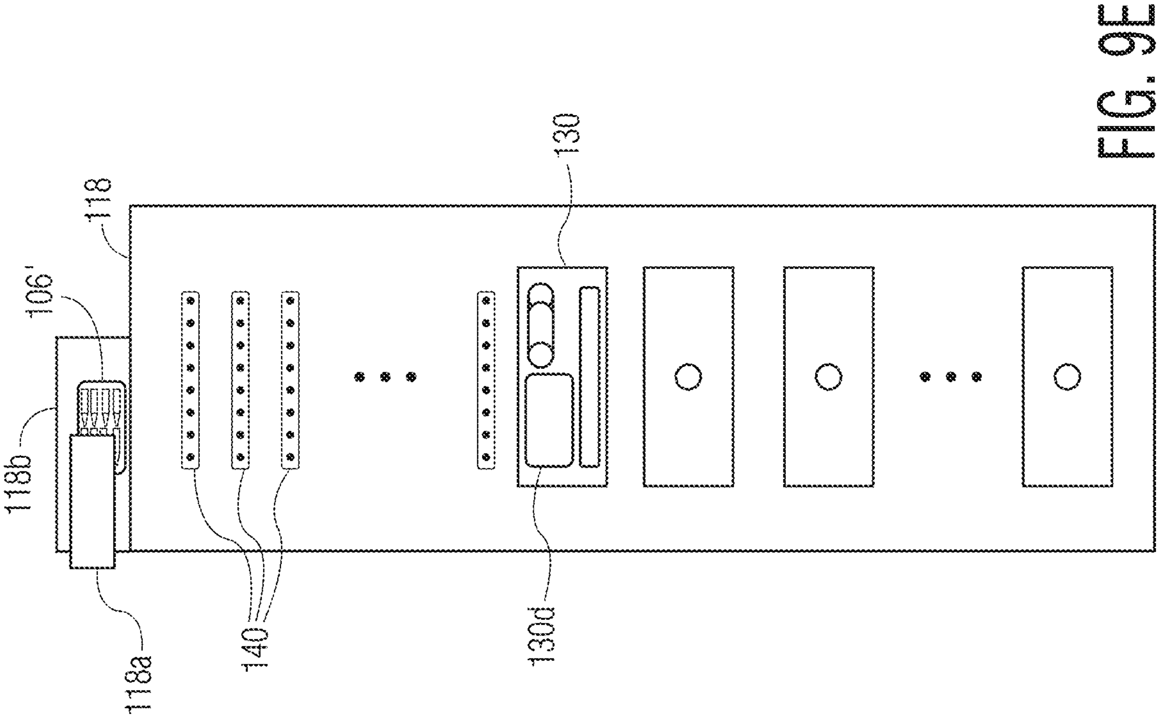

In FIG. 9B, replacement assembly 118*a* has moved to wire bonding tool replacement system 130 to remove an empty wire bonding tool tray 140 from wire bonding tool replacement system 130. In FIG. 9C, replacement assembly 118*a* has taken empty wire bonding tool tray 140 out of wire bonding tool replacement system 130 and moved it to waste receptacle 118*b*. In FIG. 9D, wire bonding tool tray 140 has been deposited in waste receptacle 118*b*, and replacement assembly 118*a* has returned to wire bonding tool replacement system 130 to remove the used wire bonding tools 106'. In FIG. 9E, replacement assembly 118*a* has removed used wire bonding tools 106' (e.g., with or without used wire bonding tool receptacle 130*d*) from wire bonding tool replacement system 130 and brought them to waste receptacle 118*b*. In FIG. 9F, used wire bonding tools 106' have been deposited in waste receptacle 118*b*.

Figure 9G:
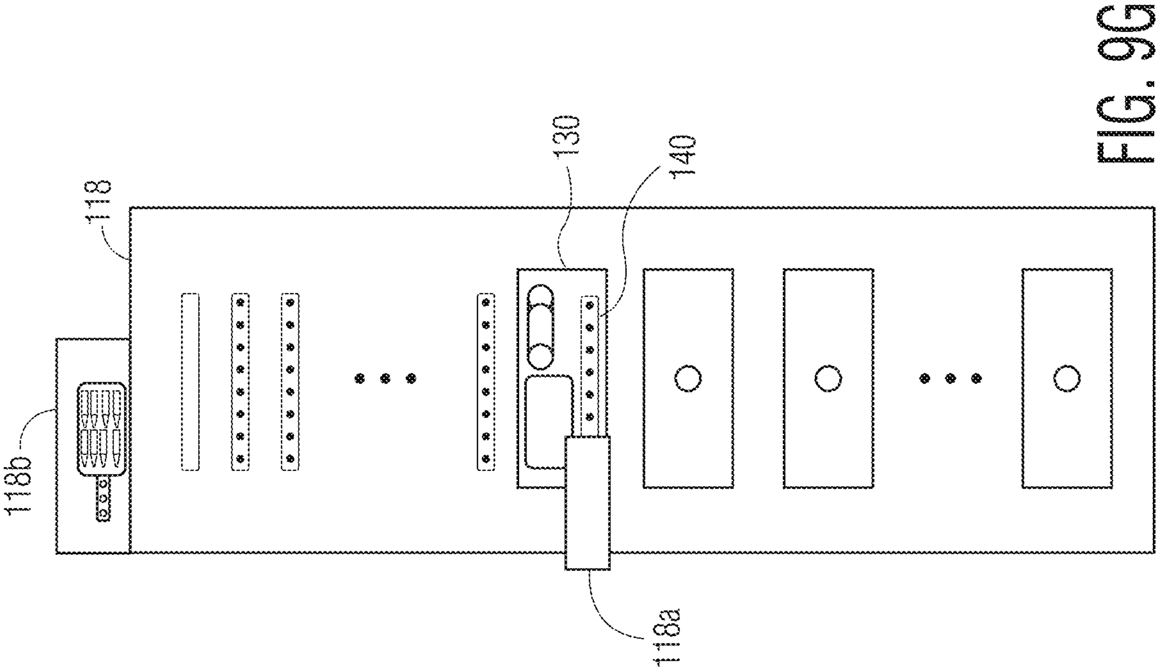
Figure 9H:
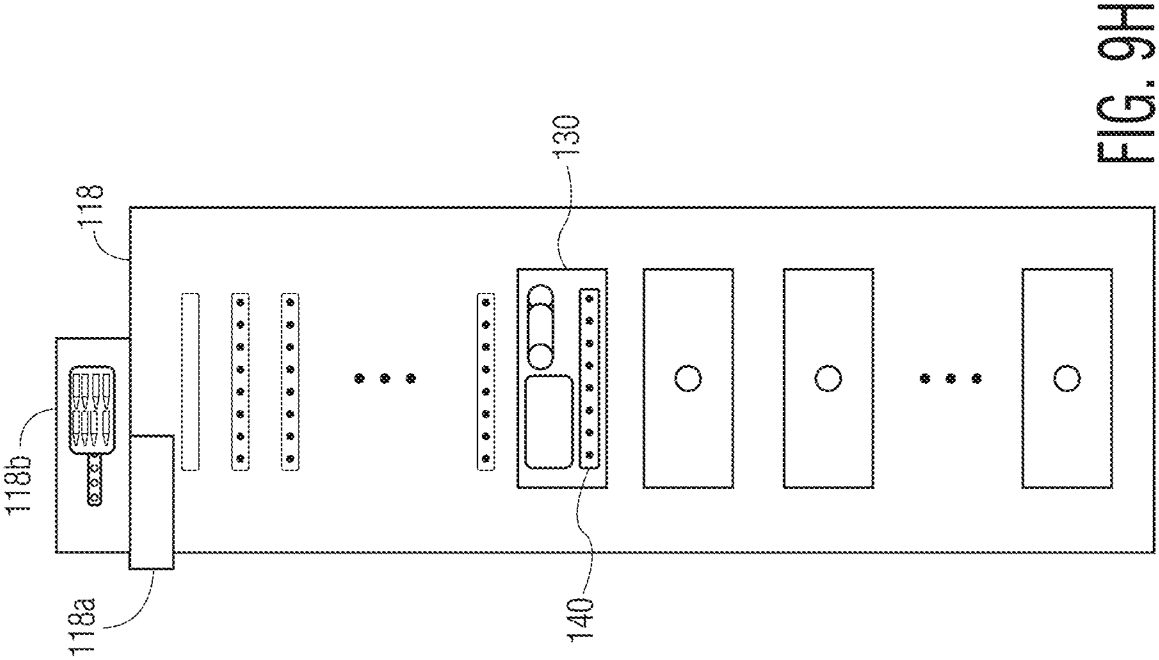

Additionally, FIG. 9F illustrates replacement assembly 118*a* in the process of picking up one of the plurality of wire bonding tool trays 140 to load into wire bonding tool replacement system 130. In FIG. 9G, replacement assembly 118*a* is shown loading wire bonding tool tray 140 into wire bonding tool replacement system 130. FIG. 9H illustrates replacement assembly 118*a* in a home position, and wire bonding tool replacement system 130 in a "ready" state.

As will be appreciated by those skilled in the art, replacement assembly 118*a* may include multiple different mechanisms for carrying out the purpose of removing waste and/or loading a wire bonding tool tray (e.g., one or more mechanisms for carrying out the following: for removing waste from used wire bonding tool receptacle 130*d;* for removing empty wire bonding tool tray 140; and/or for loading a wire bonding tool tray 140).

Although maintenance station 118 has been illustrated and described as using a replacement assembly for certain functions (e.g., discarding waste, servicing and/or refreshing wire bonding tool replacement systems 130, etc.), the invention is not so limited. For example, operators may perform certain of these functions. Thus, a replacement assembly may be different from that shown herein, and in fact may be omitted in certain applications.

Although maintenance station 118 has been illustrated and described as including only wire bonding tool replacement systems and wire bonding tool trays, the invention is not limited to such. It is contemplated that a maintenance station could include additional elements used in wire bonding operations. For example, a maintenance station could include workpieces (e.g., workpieces to be bonded, completed workpieces, magazines for holding a plurality of workpieces to be bonded or completed workpieces, etc.), wire spools, or other consumables, each of which able to be distributed by a service robot to the plurality of wire bonding systems (e.g., wherein a singular service robot is configured to move and/or install each of the consumables stored at the maintenance station).

Figure 10:
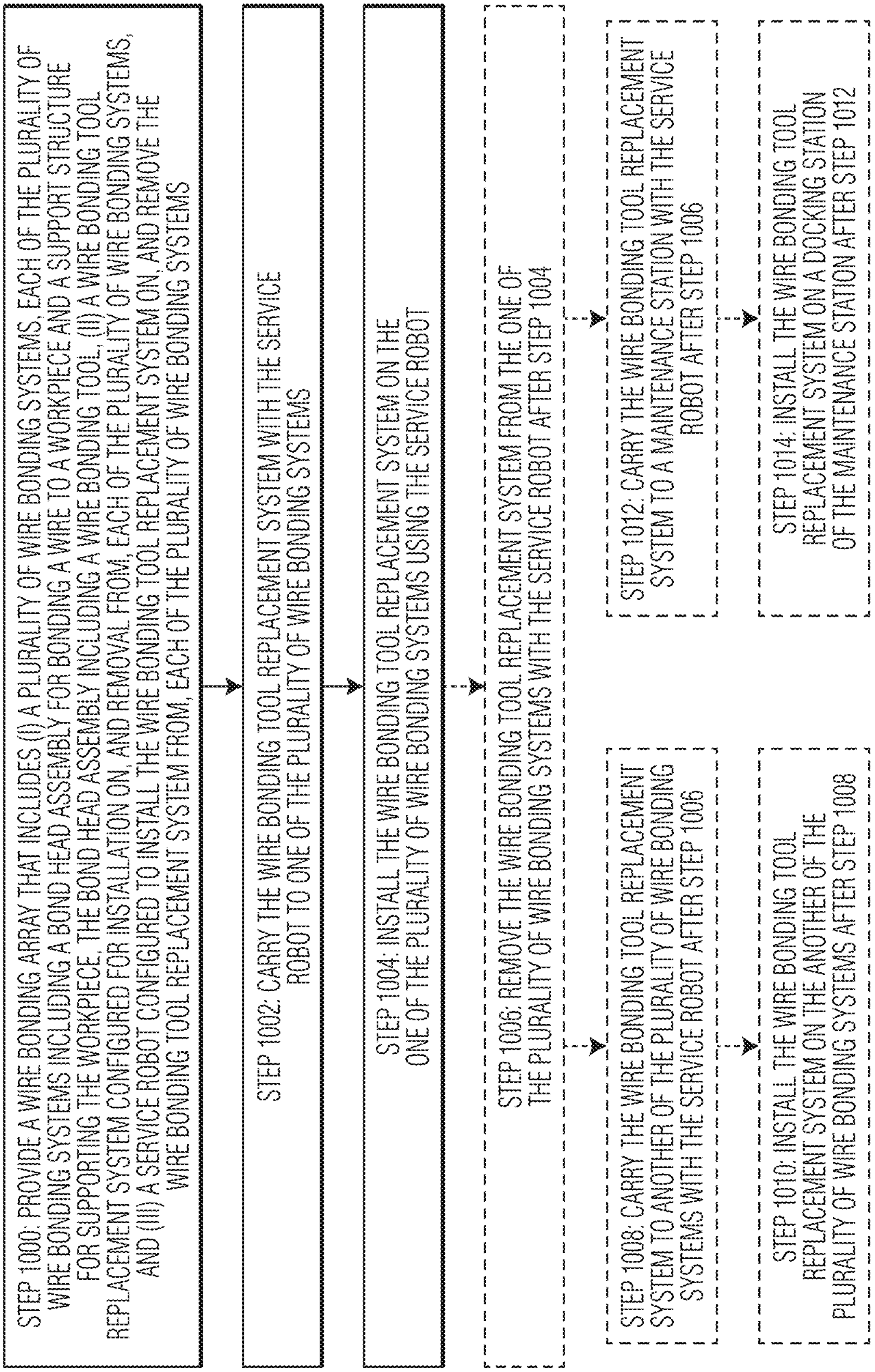
FIG. 10 is a flow diagram illustrating a method of servicing a wire bonding array in accordance with an exemplary embodiment of the invention.
Figure 11:
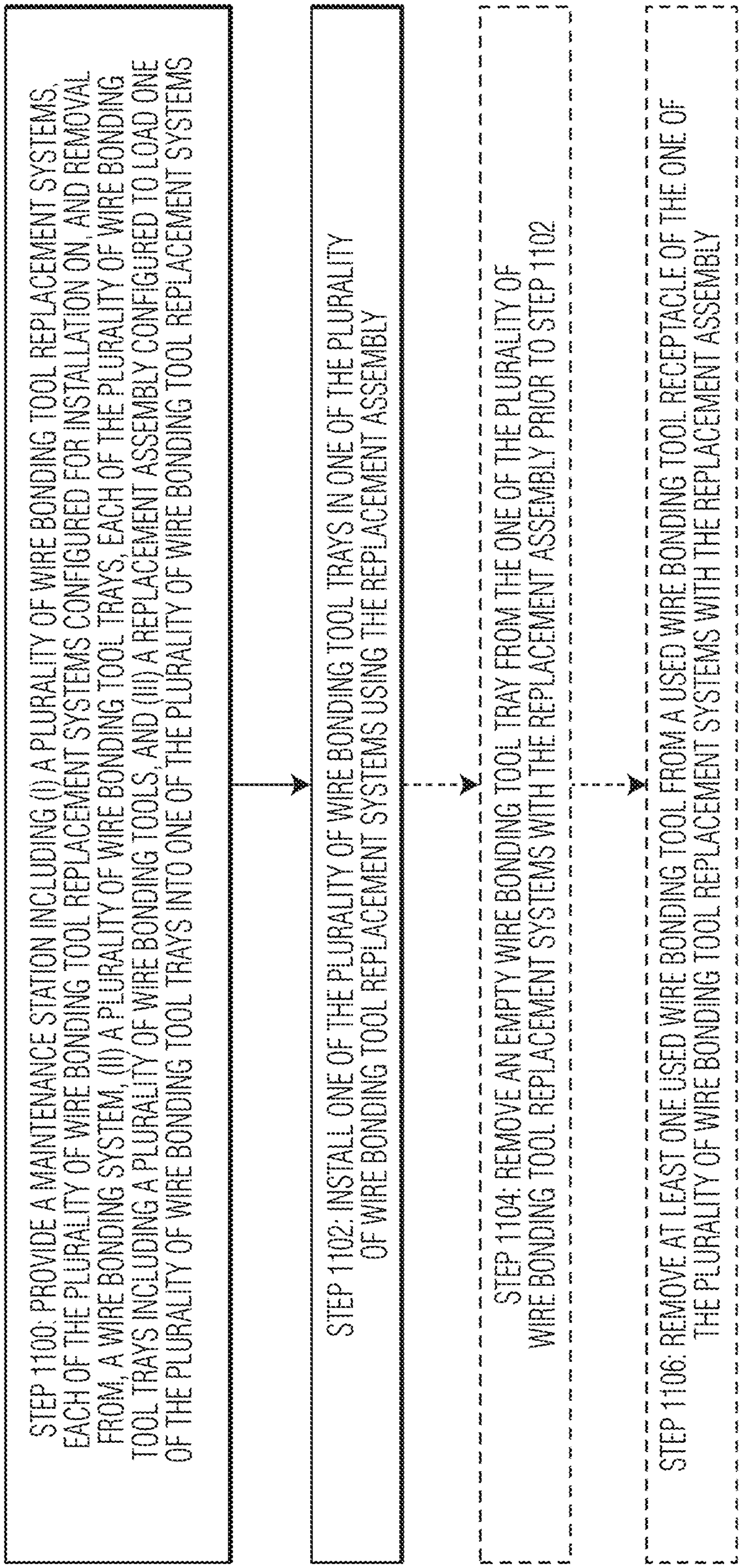
FIG. 11 is a flow diagram illustrating a method of operating a maintenance station of a wire bonding array in accordance with another exemplary embodiment of the invention.

FIGS. 10-11 are flow diagrams describing methods related to the above-described wire bonding arrays. As is understood by those skilled in the art, certain steps included in the flow diagram may be omitted; certain additional steps may be added; and the order of steps may be altered from the order illustrated—all within the scope of the invention.

Referring now to FIG. 10, at Step 1000, a wire bonding array is provided (e.g., wire bonding array 10 of FIGS.

4A-4E, 5A-5E, 6A-6D, and 7A-7E, wire bonding array 20 of FIGS. 8A and 8B, wire bonding array 30 of FIG. 8C, etc.). The wire bonding array includes a plurality of wire bonding systems, each of the plurality of wire bonding systems includes a bond head assembly for bonding a wire to a workpiece and a support structure for supporting the work piece, the bond head assembly including a wire bonding tool (e.g., see wire bonding system 100 in FIGS. 1A-1C). The wire bonding array also includes a wire bonding tool replacement system configured for installation on, and removal from, each of the plurality of wire bonding systems (e.g., see wire bonding tool replacement system 130 of FIGS. 3A-3B). The wire bonding array further includes a service robot configured to install the wire bonding tool replacement system on, and remove the wire bonding tool replacement system from, each of the plurality of wire bonding systems (e.g., see service robot 150 of FIGS. 4A-4E, 5A-5E, 6A-6D, and 7A-7E).

At Step 1002, the wire bonding tool replacement system is carried by the service robot to one of the plurality of wire bonding systems (e.g., see FIG. 4C). At Step 1004, the wire bonding tool replacement system is installed on the one of the plurality of wire bonding systems using the service robot (e.g., see FIG. 4D). At optional Step 1006, the wire bonding tool replacement system is removed from the one of the plurality of wire bonding systems with the service robot after Step 1004 (e.g., see FIGS. 5B and 6B).

After the wire bonding tool replacement system is removed from the wire bonding system in optional Step 1006, one of two things may occur, either optional Steps 1008 and 1010 or optional Steps 1012 and 1014. In optional Step 1008, the wire bonding tool replacement system is carried to another of the plurality of wire bonding systems with the service robot (e.g., see FIG. 5C) after optional Step 1006. In optional Step 1010, the wire bonding tool replacement system is installed on the another of the plurality of wire bonding systems after optional Step 1008 (e.g., see FIG. 5D). In optional Step 1012, the wire bonding tool replacement system is carried to a maintenance station by the service robot after optional Step 1006 (e.g., see FIG. 6C). In optional Step 1014, the wire bonding tool replacement system is installed on a docking station of the maintenance station after Step 1012 (e.g., see FIGS. 6C and 6D).

Referring now to FIG. 11, at Step 1100 a maintenance station is provided e.g., see FIGS. 9A-9H). The maintenance station includes a plurality of wire bonding tool replacement systems, each of the plurality of wire bonding tool replacement systems configured for installation on, and removal from, a wire bonding system. The maintenance station also includes a plurality of wire bonding tool trays, each of the plurality of wire bonding tool trays including a plurality of wire bonding tools (e.g., plurality of wire bonding tool trays 140 of FIGS. 9A-9H). The maintenance station further includes a replacement assembly configured to load one of the plurality of wire bonding tool trays into one of the plurality of wire bonding tool replacement systems (e.g., replacement assembly 118*a* of FIGS. 9A-9H). At Step 1102, one of the plurality of wire bonding tool trays is installed in one of the plurality of wire bonding tool replacement systems using the replacement assembly (see, e.g., FIGS. 9F-9G). At optional Step 1104, an empty wire bonding tool tray is removed from the one of the plurality of wire bonding tool replacement systems with the replacement assembly prior to step 1102 (e.g., see FIGS. 9B-9C). In optional step 1106, at least one used wire bonding tool is removed from a used wire bonding tool receptacle of the one of the plurality of wire bonding tool replacement systems with the replacement assembly (e.g., see FIGS. 9D-9E).

Although the invention is illustrated and described herein as including only one type of wire bonding tool replacement system, the invention is not intended to be limited thereto. As will be appreciated by those skilled in the art, wire bonding tool replacement systems may be configured in different ways, including compatibility with different wire bonding tools, or including additional features, and each wire bonding tool replacement system included in the wire bonding array need not be the same.

Although the invention is illustrated and described herein as including only a single service robot, the invention is not intended to be limited thereto. A single service robot was illustrated and described solely for clarity and conciseness. It is contemplated that a wire bonding array would likely include a plurality of service robots.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wire bonding array comprising:

a plurality of wire bonding systems, each of the plurality of wire bonding systems including (i) a bond head assembly for bonding a wire to a workpiece and (ii) a support structure for supporting the workpiece;

a maintenance station including a plurality of wire bonding tool replacement systems, each of the plurality of wire bonding tool replacement systems being configured for installation on, and removal from, each of the plurality of wire bonding systems, the maintenance station including a plurality of wire bonding tool trays, each of the plurality of wire bonding tool trays configured to be loaded into ones of the plurality of wire bonding tool replacement systems, wherein the maintenance station further includes a replacement assembly configured to service each of the plurality of wire bonding tool replacement systems to a ready state, wherein the replacement assembly is configured to load one of the plurality of wire bonding tool trays into one of the plurality of wire bonding tool replacement systems; and a service robot configured to move ones of the plurality of wire bonding tool replacement systems between the maintenance station and ones of the plurality of wire bonding systems.

2. The wire bonding array of claim 1 wherein each of the plurality of wire bonding systems includes a docking station configured to receive each of the plurality of wire bonding tool replacement systems.

3. The wire bonding array of claim 1 wherein the maintenance station includes a plurality of docking stations, each of the plurality of docking stations configured to receive each of the plurality of wire bonding tool replacement systems.

4. The wire bonding array of claim 1 wherein the replacement assembly is configured to remove a waste from each of the plurality of wire bonding tool replacement systems, the waste including at least one of (i) an empty wire bonding tool tray configured for holding a plurality of wire bonding tools and (ii) at least one used wire bonding tool.

5. The wire bonding array of claim 4 wherein the maintenance station further includes a receptacle for receiving the waste from the plurality of wire bonding tool replacement systems from the replacement assembly.

6. The wire bonding array of claim 1 wherein each of the plurality of wire bonding systems includes a docking station configured to receive each of the plurality of wire bonding tool replacement systems, the docking station including a connector for providing power and data to a received one of the wire bonding tool replacement systems.

7. The wire bonding array of claim 1 wherein each of the plurality of wire bonding systems includes a docking station configured to receive each of the plurality of wire bonding tool replacement systems, the docking station including locator pins for aligning one of the wire bonding tool replacement systems during installation.

8. The wire bonding array of claim 1 wherein the maintenance station further includes a charging station for the service robot.

9. The wire bonding array of claim 1 wherein the service robot is further configured to move ones of the plurality of wire bonding tool replacement systems directly between ones of the plurality of wire bonding systems.

10. The wire bonding array of claim 1 wherein the service robot includes a base for moving the service robot with respect to the plurality of wire bonding systems, the base being positioned above a receiving portion of each of the plurality of wire bonding systems configured to receive each of the plurality of wire bonding tool replacement systems.

11. A maintenance station for servicing a wire bonding array, the maintenance station comprising:

a plurality of wire bonding tool replacement systems, each of the plurality of wire bonding tool replacement systems being configured for installation on, and removal from, a wire bonding system;

a replacement assembly configured to service each of the plurality of wire bonding tool replacement systems to a ready state;

a plurality of wire bonding tool trays, each of the plurality of wire bonding tool trays configured to be loaded into ones of the plurality of wire bonding tool replacement systems, wherein the replacement assembly is configured to load one of the plurality of wire bonding tool trays into one of the plurality of wire bonding tool replacement systems; and a service robot configured to move one of the plurality of wire bonding tool replacement systems between the maintenance station and the wire bonding system.

12. The maintenance station of claim 11 further comprising a plurality of docking stations configured to receive any one of the plurality of wire bonding tool replacement systems.

13. The maintenance station of claim 11 wherein the replacement assembly is configured to remove a waste from each of the plurality of wire bonding tool replacement systems, the waste including at least one of (i) an empty wire bonding tool tray configured for holding a plurality of wire bonding tools and (ii) at least one used wire bonding tool.

14. The maintenance station of claim 13 further comprising a receptacle for receiving the waste from the plurality of wire bonding tool replacement systems.

15. The wire bonding array of claim 1 wherein each of the plurality of wire bonding systems includes a docking station configured to receive each of the plurality of wire bonding tool replacement systems, wherein the docking station includes an alignment structure for guiding one of the plurality of wire bonding tool replacement systems into position during installation.

16. The wire bonding array of claim 1 wherein the service robot includes a base for moving the service robot with respect to the plurality of wire bonding systems, the base being positioned above a receiving portion of each of the plurality of wire bonding systems configured to receive one of the plurality of wire bonding tool replacement systems.

17. The maintenance station of claim 11 wherein the maintenance station further includes a charging station for the service robot.

18. The maintenance station of claim 11 wherein the service robot is further configured to move ones of the plurality of wire bonding tool replacement systems directly between ones of a plurality of wire bonding systems.

19. Maintenance station of claim 11 wherein the service robot includes a base for moving the service robot with respect to a plurality of wire bonding systems, the base being positioned above a receiving portion of each of the plurality of wire bonding systems configured to receive one of the plurality of wire bonding tool replacement systems.

* * * * *